US009252565B2

(12) United States Patent
Oki et al.

(10) Patent No.: US 9,252,565 B2
(45) Date of Patent: Feb. 2, 2016

(54) LIGHT-EMITTING ELEMENT

(71) Applicant: Sony Corporation, Tokyo (JP)

(72) Inventors: Tomoyuki Oki, Kanagawa (JP); Yuji Masui, Kanagawa (JP); Yoshinori Yamauchi, Tokyo (JP); Rintaro Koda, Tokyo (JP); Takahiro Arakida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/518,382

(22) Filed: Oct. 20, 2014

(65) Prior Publication Data

US 2015/0036710 A1    Feb. 5, 2015

Related U.S. Application Data

(63) Continuation of application No. 14/273,067, filed on May 8, 2014, which is a continuation of application No. 12/078,681, filed on Apr. 3, 2008, now Pat. No. 8,761,221.

(30) Foreign Application Priority Data

Apr. 18, 2007    (JP) .................................. 2007-109654

(51) Int. Cl.
*H01S 5/00* (2006.01)
*H01S 5/125* (2006.01)
(Continued)

(52) U.S. Cl.
CPC ................. *H01S 5/125* (2013.01); *B82Y 20/00* (2013.01); *H01S 5/0425* (2013.01); *H01S 5/18* (2013.01);
(Continued)

(58) Field of Classification Search
CPC ..... H01S 5/0425; H01S 5/18311; H01S 5/22; H01S 2301/176; H01S 2301/18; H01S 5/18338
USPC ........... 372/43.01, 50.1, 50.124, 45.01, 46.01
See application file for complete search history.

(56) References Cited

U.S. PATENT DOCUMENTS 4,783,788 A    11/1988  Gordon
2004/0156409 A1  8/2004  Sato
(Continued)

FOREIGN PATENT DOCUMENTS

JP    02-065288       3/1990
JP    08-213712 A     8/1996
(Continued)

OTHER PUBLICATIONS

Japanese Office Action issued Jul. 3, 2012 for corresponding Japanese Appliication No. 2007-109654.
(Continued)

*Primary Examiner* — Jessica Stultz
*Assistant Examiner* — Delma R Forde
(74) *Attorney, Agent, or Firm* — Michael Best & Friedrich LLP

(57) ABSTRACT

A light-emitting element includes a mesa structure in which a first compound semiconductor layer of a first conductivity type, an active layer, and a second compound semiconductor layer of a second conductivity type are disposed in that order, wherein at least one of the first compound semiconductor layer and the second compound semiconductor layer has a current constriction region surrounded by an insulation region extending inward from a sidewall portion of the mesa structure; a wall structure disposed so as to surround the mesa structure; at least one bridge structure connecting the mesa structure and the wall structure, the wall structure and the bridge structure each having the same layer structure as the portion of the mesa structure in which the insulation region is provided; a first electrode; and a second electrode disposed on a top face of the wall structure.

24 Claims, 20 Drawing Sheets

(51) Int. Cl.
*B82Y 20/00* (2011.01)
*H01S 5/042* (2006.01)
*H01S 5/183* (2006.01)
*H01S 5/18* (2006.01)
*H01S 5/22* (2006.01)
*H01S 5/343* (2006.01)

(52) U.S. Cl.
CPC .............. *H01S 5/18311* (2013.01); *H01S 5/22* (2013.01); *H01S 5/343* (2013.01); *H01S 5/18338* (2013.01); *H01S 5/3432* (2013.01); *H01S 2301/176* (2013.01); *H01S 2301/18* (2013.01)

(56) References Cited

U.S. PATENT DOCUMENTS

| | | | |
|---|---|---|---|
| 2005/0238076 A1* | 10/2005 | Kuwata et al. | 372/50.1 |
| 2007/0014324 A1* | 1/2007 | Maeda et al. | 372/46.01 |
| 2008/0056323 A1* | 3/2008 | Yoshikawa et al. | 372/46.01 |
| 2008/0279241 A1* | 11/2008 | Oki et al. | 372/45.01 |
| 2009/0196318 A1* | 8/2009 | Uchida | B82Y 20/00 372/45.01 |
| 2013/0188659 A1* | 7/2013 | Kondo et al. | 372/45.01 |

FOREIGN PATENT DOCUMENTS

| | | |
|---|---|---|
| JP | 09-223841 A | 8/1997 |
| JP | 11-150340 | 6/1999 |
| JP | 2990837 | 10/1999 |
| JP | 2002-223033 A | 8/2002 |
| JP | 2003-324251 A | 11/2003 |
| JP | 2004-214332 A | 7/2004 |
| JP | 2004-319553 | 11/2004 |
| JP | 2004-319553 A | 11/2004 |
| JP | 2005-026625 | 1/2005 |
| JP | 2005-045107 A | 2/2005 |
| JP | 2006-066482 A | 3/2006 |
| JP | 2006-156947 A | 6/2006 |

OTHER PUBLICATIONS

Japanese Office Action issued Dec. 11, 2012 for corresponding Japanese Application No. 2007-109654.

* cited by examiner

[STEP-150]

[STEP-100]

[STEP-110]

[STEP-120]

[STEP-130]

[STEP-130] (CONTINUATION)

[STEP-140]

[STEP-110]

[STEP-120]

[STEP-130]

[STEP-250]

[STEP-210]

[STEP-220]

[STEP-230]

[STEP-240]

[STEP-210]

[STEP-220]

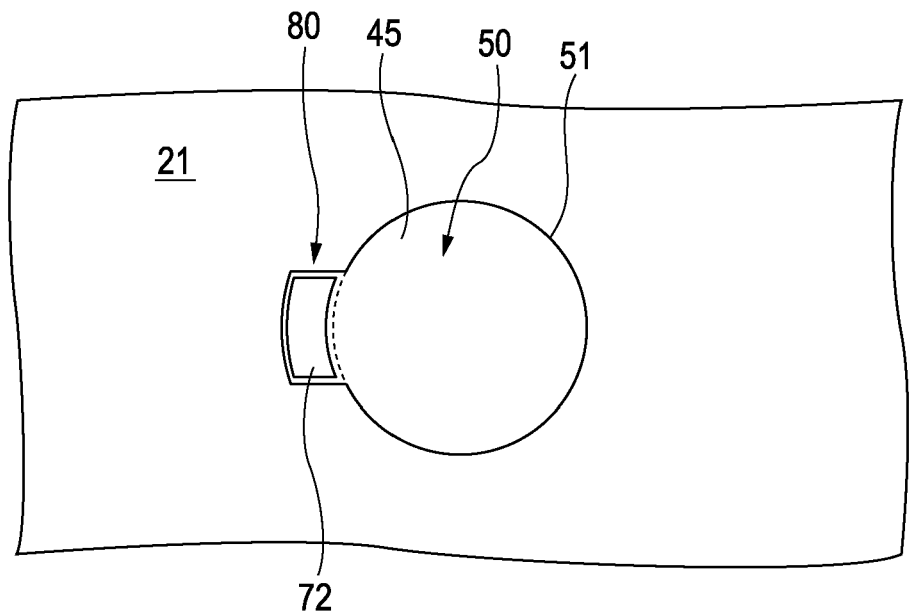
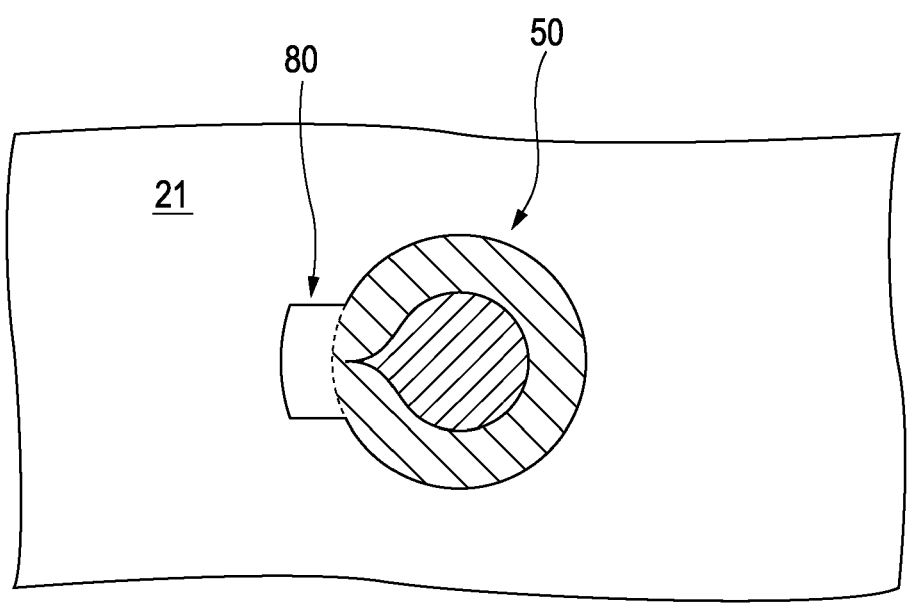

[STEP-360]

PHANTOM CLOSED CURVE

[STEP-310]

[STEP-320]

[STEP-320] (CONTINUATION)

[STEP-330]

[STEP-340]

[STEP-340] (CONTINUATION)

[STEP-310]

[STEP-310]

[STEP-320]

[STEP-320] (CONTINUATION)

[STEP-330]

[STEP-340]

LIGHT-EMITTING ELEMENT

CROSS REFERENCES TO RELATED APPLICATIONS

This is a Continuation of application Ser. No. 14/273,067, filed on May 8, 2014, which is a Continuation of application Ser. No. 12/078,681, filed on Apr. 3, 2008. The present invention contains subject matter related to Japanese Patent Application JP 2007-109654, filed in the Japanese Patent Office on Apr. 18, 2007, the entire contents of which are incorporated herein by reference.

BACKGROUND OF THE INVENTION

1. Field of the Invention

The present invention relates to a light-emitting element and a method for manufacturing the same.

2. Description of the Related Art

In a surface-emitting laser element, on a substrate, for example, an active layer having a multiple quantum well structure is disposed in a cavity sandwiched between two mirror layers provided on upper and lower sides thereof, light emitted from the active layer under current injection is confined, and thus laser oscillation is caused. In such a surface-emitting laser element, a cylindrical mesa structure is usually employed, for example, as disclosed in Japanese Unexamined Patent Application Publication No. 2005-026625. Specifically, for example, a cylindrical mesa structure with a diameter of about 30 μm is formed by dry etching or the like. Alternatively, as disclosed in each of Japanese Unexamined Patent Application Publication Nos. 11-150340 and 2004-319553, a mesa structure surrounded by a protrusion is formed. These mesa structures each have, for example, a laminate structure including an n-type compound semiconductor layer, an active layer, and a p-type compound semiconductor layer. By oxidizing a part of the p-type compound semiconductor layer from the sidewall portion of the mesa structure, a current constriction region is provided in the center of the p-type compound semiconductor layer. Then, the mesa structure is coated with an insulating layer, a part of the insulating layer on the top face of the p-type compound semiconductor layer is removed, and a ring-like p-side electrode is formed on the periphery of the top face of the p-type compound semiconductor. In addition, an n-side electrode is formed on the back face of the substrate. By providing such a current constriction region, current can be injected with high efficiency into the active layer. In the surface-emitting laser element having such a structure, current is efficiently injected into the active layer, and highly efficient laser oscillation can be obtained.

A mesa structure is usually formed using photolithographic and etching techniques. Furthermore, when a current constriction region is formed, a p-type compound semiconductor layer is often oxidized in a high-temperature water vapor atmosphere. The oxidizing treatment is controlled by adjusting the time for which the p-type compound semiconductor layer is exposed to the high-temperature water vapor atmosphere. Furthermore, a p-side electrode is usually formed using photolithographic and etching techniques or a lift-off technique.

SUMMARY OF THE INVENTION

In such a case as described above, a relatively large displacement may occur between a current constriction region and a p-type electrode disposed on the top face of a second compound semiconductor layer because of a combination of factors, such as (1) a misalignment of a photomask during the formation of a mesa structure, (2) a variation in the width of the current constriction region or the width of an oxidized region or a relative displacement of the current constriction region resulting from the fact that the rate at which the oxidation of a p-type compound semiconductor layer proceeds varies depending on the feed rate of high-temperature water vapor, ambient temperature, substrate temperature, thickness of the compound semiconductor layer, impurity concentration of the compound semiconductor layer, etc., and (3) a misalignment of a photomask during the formation of the p-side electrode. As a result, a part of the light from an active layer is blocked by the p-side electrode. If such a phenomenon occurs, in addition to the loss of optical output, a problem arises in which a defect occurs in the far-field pattern (FFP), which is an important parameter when emitted light is collected by a lens or guided to an optical fiber.

It may be conceived that a p-side electrode is disposed on the top face of a second compound semiconductor layer sufficiently apart from the space above a current constriction region so that light from an active layer is not blocked by the p-side electrode even if a large displacement occurs between the current constriction region and the p-side electrode disposed on the top face of the second compound semiconductor layer. However, such an approach is not desirable because it is difficult to satisfy requirements for reduction in size of mesa structures and reduction in size of current constriction regions, or because it is difficult to form very small current constriction regions.

It is desirable to provide a light-emitting element having a configuration and structure that can reliably prevent a phenomenon that light from an active layer is blocked by a p-side electrode, and a method for manufacturing such a light-emitting element.

According to a first embodiment of the present invention, a light-emitting element includes a mesa structure in which a first compound semiconductor layer of a first conductivity type, an active layer, and a second compound semiconductor layer of a second conductivity type are disposed in that order, wherein at least one of the first compound semiconductor layer and the second compound semiconductor layer has a current constriction region surrounded by an insulation region extending inward from a sidewall portion of the mesa structure; a wall structure disposed so as to surround the mesa structure, the wall structure having the same layer structure as a portion of the mesa structure in which the insulation region is provided; at least one bridge structure connecting the mesa structure and the wall structure, the bridge structure having the same layer structure as the portion of the mesa structure in which the insulation region is provided; a first electrode electrically connected to the first compound semiconductor layer; and a second electrode disposed on a top face of the wall structure, the second electrode being electrically connected to the second compound semiconductor layer of the mesa structure through the bridge structure.

Here, the phrase "each of the wall structure and the bridge structure having the same layer structure as the portion of the mesa structure in which the insulation region is provided" means that each of the wall structure and the bridge structure has a layer structure in which the first compound semiconductor layer of the first conductivity type, the active layer, and the second compound semiconductor layer of the second conductivity type are disposed in that order, wherein at least one of the first compound semiconductor layer and the second compound semiconductor layer has an insulation region. As described above, each of the wall structure and the bridge structure has the insulation region. Specifically, such an insulation region is, for example, disposed at least in a portion arranged in the thickness direction of at least one of the first compound semiconductor layer and the second compound semiconductor layer. In each of the wall structure and the bridge structure, a phantom cross-section of the insulating region taken along the interface between the second compound semiconductor layer and the active layer is entirely occupied by the insulation region. Hereinafter, the same applies.

A method for manufacturing a light-emitting element according to the first embodiment of the present invention includes the steps of (A) forming a first compound semiconductor layer of a first conductivity type, an active layer, and a second compound semiconductor layer of a second conductivity type in that order; (B) selectively removing a part of at least the second compound semiconductor layer and the active layer to partially expose the first compound semiconductor layer, thereby obtaining a mesa structure in which the first compound semiconductor layer, the active layer, and the second compound semiconductor layer are disposed in that order, a wall structure having the same layer structure as the mesa structure, the wall structure being disposed so as to surround the mesa structure, and at least one bridge structure having the same layer structure as the mesa structure, the bridge structure connecting the mesa structure and the wall structure; (C) performing insulating treatment on a part of at least one of the first compound semiconductor layer and the second compound semiconductor layer constituting the mesa structure from a sidewall portion of the mesa structure to form an insulation region, an outer edge of which extends to the sidewall portion of the mesa structure, thereby obtaining a current constriction region surrounded by the insulation region in at least one of the first compound semiconductor layer and the second compound semiconductor layer, and simultaneously performing insulating treatment on at least one of the first compound semiconductor layer and the second compound semiconductor layer in each of the wall structure and the bridge structure, from a side face of the wall structure or the bridge structure to form an insulation region; and (D) providing a first electrode which is electrically connected to a part of the exposed first compound semiconductor layer, and providing a second electrode on a top face of the wall structure.

In the light-emitting element according to the first embodiment of the present invention or the method for manufacturing the light-emitting element according to the first embodiment of the present invention (hereinafter, may be simply referred to as the "first embodiment of the present invention"), the second electrode is provided on the top face of the wall structure. The second electrode may be provided entirely or partially on the top face of the wall structure. Furthermore, the second electrode may be provided continuously or discontinuously on the top face of the wall structure.

In the first embodiment of the present invention, the light-emitting element may further include a second electrode extending portion which extends from the second electrode to a lower end of the wall structure over an insulating layer provided on an outer side face of the wall structure.

In the first embodiment of the present invention, preferably the relationship $W_W/W_I \leq 2$ is satisfied, and more preferably the relationship $W_W/W_I \leq 1$ is satisfied, wherein $W_W$ is the width of the insulation region in the wall structure in a phantom cross-section of the wall structure taken parallel to the interface between the second compound semiconductor layer and the active layer, and $W_I$ is the width of the insulation region in the mesa structure in a phantom cross-section of the mesa structure taken parallel to the interface between the second compound semiconductor layer and the active layer. Furthermore, preferably, the relationship $W_B/W_I \leq 2$ is satisfied, and more preferably, $W_B/W_I \leq 1$ is satisfied, wherein $W_B$ is the width of the insulation region in the bridge structure in a phantom cross-section of the bridge structure taken parallel to the interface between the second compound semiconductor layer and the active layer. Furthermore, in a phantom cross-section of the insulation regions of the mesa structure and the wall structure taken parallel to the interface between the second compound semiconductor layer and the active layer, the minimum value of the shortest distance between the mesa structure and the wall structure is preferably $2.5 \times 10^{-6}$ m, and more preferably $1.0 \times 10^{-6}$ m. Note that a phantom cross-section taken parallel to the interface between the second compound semiconductor layer and the active layer is equivalent to a phantom cross-section taken parallel to the interface between the first compound semiconductor layer and the active layer.

In the first embodiment of the present invention, including the preferred embodiments described above, in a phantom cross-section of the wall structure taken parallel to the interface between the second compound semiconductor layer and the active layer, the cross-sectional shape of the wall structure may be annular, and in a phantom cross-section of the mesa structure taken parallel to the interface between the second compound semiconductor layer and the active layer, the cross-sectional shape of the mesa structure may be circular, although not limited thereto.

Furthermore, in the first embodiment of the present invention, including the preferred embodiments described above, the number of bridge structures is one or more. For example, the number of bridge structures is one, two (in the case where the bridge structures are arranged on a phantom straight line), three (in the case where the bridge structures are arranged on the vertices of a phantom equilateral triangle), four (in the case where the bridge structures are arranged on the vertices of a phantom square), five (in the case where the bridge structures are arranged on the vertices of a phantom equilateral pentagon), six (in the case where the bridge structures are arranged on the vertices of a phantom equilateral hexagon), or eight (in the case where the bridge structures are arranged on the vertices of a phantom equilateral octagon). Note that the number of bridge structures corresponds to the number of feeding points for feeding a current to the second compound semiconductor layer. Furthermore, the number of second electrode extending portions which extend from the second electrode over the insulating layer provided on the outer side face of the wall structure is one at the minimum. In the case where a plurality of second electrode extending portions extend from the second electrode over the insulating layer provided on the outer side face of the wall structure, the second electrode extending portions that extend to the insulating layer provided on the first compound semiconductor layer may be finally combined into one.

According to a second embodiment of the present invention, a light-emitting element includes a mesa structure in which a first compound semiconductor layer of a first conductivity type, an active layer, and a second compound semiconductor layer of a second conductivity type are disposed in that order, wherein at least one of the first compound semiconductor layer and the second compound semiconductor layer has a current constriction region surrounded by an insulation region extending inward from a sidewall portion of the mesa structure; at least one protrusion having the same layer structure as a portion of the mesa structure in which the insulation region is provided, the protrusion protruding from the sidewall portion of the mesa structure; a first electrode electrically connected to the first compound semiconductor layer; and a second electrode disposed on a top face of the protrusion, the second electrode being electrically connected to the second compound semiconductor layer.

A method for manufacturing a light-emitting element according to the second embodiment of the present invention includes the steps of (A) forming a first compound semiconductor layer of a first conductivity type, an active layer, and a second compound semiconductor layer of a second conductivity type in that order; (B) selectively removing a part of at least the second compound semiconductor layer and the active layer to partially expose the first compound semiconductor layer, thereby obtaining a mesa structure in which the first compound semiconductor layer, the active layer, and the second compound semiconductor layer are disposed in that order, and at least one protrusion extending from an upper end to a lower end of a sidewall portion of the mesa structure; (C) performing insulating treatment on a part of at least one of the first compound semiconductor layer and the second compound semiconductor layer constituting the mesa structure and at least one of the first compound semiconductor layer and the second compound semiconductor layer constituting the protrusion from the sidewall portion of the mesa structure and from a side face of the protrusion, respectively, to form an insulation region, an outer edge of which extends to the sidewall portion of the mesa structure and the side face of the protrusion, thereby obtaining a current constriction region surrounded by the insulation region in at least one of the first compound semiconductor layer and the second compound semiconductor layer; and (D) providing a first electrode on a part of the exposed first compound semiconductor layer, and providing a second electrode on a top face of the protrusion.

In the light-emitting element according to the second embodiment of the present invention or the method for manufacturing the light-emitting element according to the second embodiment of the present invention (hereinafter, may be simply referred to as the "second embodiment of the present invention"), the light-emitting element may further include a second electrode extending portion which extends from the second electrode to a lower end of the protrusion over an insulating layer provided on the side face of the protrusion.

In the second embodiment of the present invention, the second electrode is provided on the top face of the protrusion. Specifically, the second electrode is provided on the top face of the protrusion, or depending on the case, the second electrode may be provided so as to extend from the top face of the protrusion to an edge of the top face of the second compound semiconductor layer constituting the mesa structure. Furthermore, unlike in the related art, it is not necessary to provide the second electrode continuously, in the shape of a ring, on the periphery of the second compound semiconductor layer. Examples of the shape of the protrusion in a phantom cross-section of the protrusion taken parallel to the interface between the second compound semiconductor layer and the active layer include a triangle; a quadrangle including a square, a rectangle, a diamond, and a parallelogram; a polygon; a rounded quadrangle or polygon; a circle, an ellipse, a "capsule" shape (shape in which two semicircles and two line segments are combined), and a sector. Examples of the shape also include a "T"-shape in which the end of the vertical line of the character "T" extends from the sidewall portion of the mesa structure, and the horizontal line of the character "T" is a line segment or arc-shaped. Furthermore, the number of protrusions is one or more. For example, the number of protrusions is one, two (in the case where the protrusions are arranged on a phantom straight line), three (in the case where the protrusions are arranged on the vertices of a phantom equilateral triangle), four (in the case where the protrusions are arranged on the vertices of a phantom square), five (in the case where the protrusions are arranged on the vertices of a phantom equilateral pentagon), six (in the case where the protrusions are arranged on the vertices of a phantom equilateral hexagon), or eight (in the case where the protrusions are arranged on the vertices of a phantom equilateral octagon). Note that the number of protrusions corresponds to the number of feeding points for feeding a current to the second compound semiconductor layer. Furthermore, when a plurality of protrusions are present, the second electrode extending portions extending over the insulating layer provided on the side faces of the protrusions on the sidewall portion of the mesa structure and extending to the insulating layer provided on the first compound semiconductor layer may be finally combined into one.

According to a third embodiment of the present invention, a light-emitting element includes a mesa structure in which a first compound semiconductor layer of a first conductivity type, an active layer, and a second compound semiconductor layer of a second conductivity type are disposed in that order, wherein at least one of the first compound semiconductor layer and the second compound semiconductor layer has a current constriction region surrounded by an insulation region extending inward from a sidewall portion of the mesa structure; a plurality of point-like holes disposed in the mesa structure so as to reach at least the insulation region and extend in the lamination direction; a first electrode electrically connected to the first compound semiconductor layer; and a second electrode provided on a top face of the mesa structure in a region located on the sidewall portion side of a region in which the plurality of point-like holes are disposed, the second electrode being electrically connected to the second compound semiconductor layer.

A method for manufacturing a light-emitting element according to the third embodiment of the present invention includes the steps of (A) forming a first compound semiconductor layer of a first conductivity type, an active layer, and a second compound semiconductor layer of a second conductivity type in that order; (B) forming a plurality of point-like holes so as to extend in the thickness direction at least in a region of the second compound semiconductor layer in which a current constriction region is to be formed; (C) performing insulating treatment on a part of at least one of the first compound semiconductor layer and the second compound semiconductor layer from sidewalls of the holes to form an insulation region, thereby obtaining the current constriction region surrounded by the insulation region in at least one of the first compound semiconductor layer and the second compound semiconductor layer; (D) selectively removing a part of at least the second compound semiconductor layer and the active layer located outside the region where the holes are provided to partially expose the first compound semiconductor layer, thereby obtaining a mesa structure in which the first compound semiconductor layer, the active layer, and the second compound semiconductor layer are disposed in that order, the current constriction region surrounded by the insulation region is disposed in at least one of the first compound semiconductor layer and the second compound semiconductor layer, and an outer edge of the insulation region extends to a sidewall portion of the mesa structure; and (E) providing a first electrode on a part of the exposed first compound semiconductor layer, and providing a second electrode on an edge of a top face of the second compound semiconductor layer.

In the light-emitting element according to the third embodiment of the present invention or the method for manufacturing the light-emitting element according to the third embodiment of the present invention (hereinafter, may be simply referred to as the "third embodiment of the present invention"), the light-emitting element may further include a second electrode extending portion which extends from the second electrode to a lower end of the mesa structure over an insulating layer provided on the sidewall portion of the mesa structure.

In the third embodiment of the present invention, the second electrode is provided on the periphery of the top face of the second compound semiconductor layer. Specifically, the second electrode may be provided on a part of the periphery of the top face of the second compound semiconductor layer, or the second electrode may be provided continuously or discontinuously in the shape of a ring on the periphery of the top face of the second compound semiconductor layer. Furthermore, the number of second electrode extending portions which extend from the second electrode over the insulating layer provided on the sidewall portion of the mesa structure is one at the minimum. In the case where a plurality of second electrode extending portions extend from the second electrode over the insulating layer provided on the sidewall portion of the mesa structure, the second electrode extending portions that extend to the insulating layer provided on the first semiconductor layer may be finally combined into one.

In the second embodiment or the third embodiment of the present invention, preferably, the relationship $0<S_{Conf}/S_{E2}<1$ is satisfied, and more preferably the relationship $0<S_{Conf}/S_{E2}\leq 1/2$ is satisfied, wherein $S_{Conf}$ is the area of the current constriction region and $S_{E2}$ is the area of the top face of the second compound semiconductor layer constituting the mesa structure, or wherein $S_{Conf}$ is the area of the current constriction region and $S_{E2}$ is the area of a portion of the top face of the second compound semiconductor layer where the second electrode is not disposed. In such a case, preferably, the projection of the outer edge of the current constriction region is contained in the projection of the outer edge of the top face of the second compound semiconductor layer constituting the mesa structure, or the projection of the outer edge of the current constriction region is contained in the projection of the outer edge of the portion of the top face of the second compound semiconductor layer where the second electrode is not provided. Furthermore, the minimum value of the shortest distance between the projection of the outer edge of the current constriction region and the projection of the outer edge of the top face of the second compound semiconductor layer constituting the mesa structure, or the minimum value of the shortest distance between the projection of the outer edge of the current constriction region and the projection of the outer edge of the portion of the top face of the second compound semiconductor layer where the second electrode is not provided is preferably $2.5\times 10^{-6}$ m, and more preferably $1.0\times 10^{-6}$ m.

Furthermore, in the third embodiment of the present invention, preferably, tops of the plurality of point-like holes are arranged on a phantom closed curve. In such a case, examples of the phantom closed curve include a circle, an ellipse, a "capsule" shape; a quadrangle including a square, a rectangle, a diamond, and a parallelogram; a polygon; and a rounded quadrangle or polygon. Alternatively, when the phantom closed curve is assumed to be a circle and when the cross-sectional shape of each hole is assumed to be a circle, preferably the relationship $0<(M\times R_1^2)/R_0^2\leq 1$ is satisfied, and more preferably the relationship $0<(M\times R_1^2)/R_0^2\leq 0.2$ is satisfied, wherein $R_0$ is the diameter of the assumed circle of the phantom closed curve, $R_1$ is the diameter of the assumed circle of the cross-sectional shape of the hole, and M is the number of holes. Here, in order to obtain the diameter $R_0$, the area of a region surrounded by the phantom closed curve is calculated, a circle having the same area as the calculated area is assumed, and the diameter of the assumed circle is defined as the diameter $R_0$. Furthermore, in order to obtain the diameter $R_1$, the area of the cross-sectional shape of the hole (i.e., cross-sectional shape taken along a plane perpendicular to the axis of the hole) is calculated, a circle having the same area as the calculated area is assumed, and the diameter of the assumed circle is defined as the diameter $R_1$. Additionally, preferably, the value $R_1$, for example, satisfies the relationship 1 $\mu m\leq R_1\leq 5$ $\mu m$. Furthermore, the value M (i.e., the number of holes) is preferably 3 or more, and more preferably 8 or more. The upper limit of the value M may be appropriately set.

In the method for manufacturing the light-emitting element according to the third embodiment of the present invention, in step (C), in which insulating treatment is performed on a part of at least one of the first compound semiconductor layer and the second compound semiconductor layer from sidewalls of the holes, when insulating treatment from a sidewall of one hole allows the formation of an insulation region to proceed and when insulation treatment from a sidewall of a hole adjacent to the one hole allows the formation of an insulation region to proceed, before these two insulation regions are connected with each other, the curvature of the boundary of each insulation region (which for convenience may be referred to as an "insulation region front") on the basis of the hole (i.e., with the center of each hole being an origin) is preferably positive. Alternatively, before these two insulation regions are connected with each other, the length of the boundary (insulation region front) of each insulation region of which formation is allowed to proceed by insulating treatment preferably increases with the progress of the insulating treatment.

Furthermore, in the third embodiment of the present invention, a plurality of point-like holes which reach at least the insulation region (for example, passing through at least a portion of the second compound semiconductor layer in which the insulation region is to be formed and a portion thereon of the second compound semiconductor layer) are formed. Here, the plurality of point-like holes may pass through the second compound semiconductor layer and extend to the active layer, or may further pass through the active layer and extend to the middle of the first compound semiconductor layer. Furthermore, in the third embodiment of the present invention, the planar shape of the current constriction region is determined on the basis of the shape of the phantom closed curve on which the tops of the plurality of point-like holes are located, the number of point-like holes, the insulating rate which depends on the crystal plane orientation in the insulating treatment of the second compound semiconductor layer, etc. Therefore, the shape of the phantom closed curve and the number of point-like holes are determined so that a desired planar shape can be obtained.

In the first embodiment, the second embodiment, or the third embodiment including the preferred structures and configurations described above (hereinafter may be simply referred to as "any of the embodiments of the present invention"), the light-emitting element may have a structure in which the insulation region and the current constriction region are disposed in the second compound semiconductor layer, the second compound semiconductor layer has a three-layered structure including a lower layer, a middle layer (current constriction layer), and an upper layer disposed in that order from the active layer side, at least the middle layer is composed of a group III-V compound semiconductor containing aluminum (Al) as a group III atom, the insulation region and the current constriction region are disposed in the middle layer, and the atomic percent of aluminum (Al) in the compound semiconductor composition in the middle layer is higher than the atomic percent of aluminum (Al) in the compound semiconductor composition in each of the lower layer and the upper layer.

Examples of the group III atom include gallium (Ga) and indium (In). Examples of the group V atom include arsenic (As), phosphorus (P), and antimony (Sb). More specifically, examples of the combination of compound semiconductors constituting (middle layer/lower layer and upper layer) include (AlAs/GaAs), (AlAs/InAs), (AlAs/AlGaAs), (AlAs/AlInAs), (AlAs/AlAsP), (AlAs/GaInAs), (AlAs/AlGaInAs), (AlAs/GaInAsP), (AlP/GaP), (AlP/InP), (AlP/AlGaP), (AlP/AlInP), (AlP/AlAsP), (AlP/AlGaInP), (AlSb/AlInSb), (AlGaAs/AlGaAs), (AlInAs/AlInGaAs), (AlInAs/AlGaAs), (AlGaAs/AlGaAsP), (AlInAsP/AlGaAsP), and (AlN/AlGaN). Furthermore, examples of the compound semiconductor constituting the first compound semiconductor layer include AlAs, GaAs, AlGaAs, AlP, GaP, GaInP, AlInP, AlGaInP, AlAsP, GaAsP, AlGaAsP, AlInAsP, GaInAsP, AlInAs, GaInAs, AlGaInAs, AlAsSb, GaAsSb, AlGaAsSb, AlN, GaN, InN, and AlGaN. Examples of the compound semiconductor constituting the active layer include GaAs, AlGaAs, GaInAs, GaInAsP, GaInP, GaSb, GaAsSb, GaN, InN, and GaInN. Examples of the method for forming these layers (film deposition method) include metal-organic chemical vapor deposition (MOCVD), molecular beam epitaxy (MBE), and hydride vapor phase epitaxy in which a halogen contributes to transportation or reaction.

Furthermore, in any of the embodiments of the present invention including the preferred structures and configurations, one example of the light-emitting element is a surface-emitting laser element (vertical cavity surface-emitting laser; VCSEL) in which light is emitted from a second compound semiconductor layer constituting a mesa structure.

In the method for manufacturing the light-emitting element according to the first embodiment, the second embodiment, or the third embodiment of the present invention including the preferred structures and configurations described above (hereinafter may be simply referred to as the "manufacturing method according to any of the embodiments of the present invention"), the insulating treatment may be oxidizing treatment performed on a part of the second compound semiconductor layer, although not limited thereto. The insulating treatment may be nitriding treatment, treatment in which a part of the second compound semiconductor layer is disordered, or treatment in which ion implantation is performed on a part of the sidewall portion of the mesa structure or the sidewalls of the holes, and then thermal treatment is performed so that impurities are diffused into a part of the second compound semiconductor layer. Furthermore, in the case where oxidizing treatment is performed as the insulating treatment, the oxidizing treatment may be performed using high-temperature water vapor (e.g., in the air atmosphere containing 1% to 50% by volume of water vapor at a temperature of 50° C. to 100° C.)

Furthermore, in the manufacturing method according to any of the embodiments of the present invention, after the first electrode is formed, the second electrode may be formed. Alternatively, after the second electrode is formed, the first electrode may be formed. The insulating layer may be formed before the formation of the second electrode or after the formation of the second electrode. The second electrode and the second electrode extending portion may be formed separately or integrally.

In any of the embodiments of the present invention, by selectively removing a part of at least the second compound semiconductor layer and the active layer, a part of the first compound semiconductor layer is exposed, and a columnar (e.g., circular cylindrical or columnar) mesa structure is formed in which at least the second compound semiconductor and the active layer remain. However, in addition to the selective removal of the second compound semiconductor layer and the active layer, a part of the first compound semiconductor layer may be selectively removed in the thickness direction. That is, the mesa structure has a structure in which at least the second compound semiconductor layer and the active layer remain, for example, in the shape of an island. However, the mesa structure may have a structure in which the second compound semiconductor layer, the active layer, and a part of the first compound semiconductor layer remain, for example, in the shape of an island.

In any of the embodiments of the present invention, the mesa structure and the like can be formed, for example, by combining lithography and dry etching or wet etching, and the point-like holes may be formed by combining lithography and dry etching.

In any of the embodiments of the present invention, examples of the substrate on which the mesa structure and the like are formed include a sapphire substrate, a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, an InP substrate, and a Si substrate. An underlying layer or a buffer layer may be formed on a surface (principal surface) of any of these substrates. Furthermore, examples of the material constituting the insulating layer include a SiO$_X$ material, such as SiO$_2$, a SiN$_Y$ material, a SiO$_X$N$_Y$ material, Ta$_2$O$_5$, ZrO$_2$, AlN, and Al$_2$O$_3$. Examples of the method for forming the insulating layer include PVD, such as vacuum deposition or sputtering, and CVD.

In any of the embodiments of the present invention, the first conductivity type may be n type and the second conductivity type may be p type.

In any of the embodiments of the present invention, the lower layer of the second compound semiconductor layer (i.e., the layer close to the active layer) may be set, for example, as a second cladding layer, and the upper layer of the second compound semiconductor layer (i.e., the layer far from the active layer) may be set, for example, as a second DBR layer. Furthermore, the first compound semiconductor layer may have a laminate structure, for example, including a first DBR layer located far from the active layer and a first cladding layer located close to the active layer. In general, the optical thickness of a layer constituting the DBR layer is $\lambda/4$ (wherein $\lambda$ is the oscillation wavelength). Furthermore, examples of the n-type impurity, which is added to the compound semiconductor layer, include silicon (Si) and selenium (Se). Examples of the p-type impurity include zinc (Zn), magnesium (Mg), and beryllium (Be).

The material constituting each of the first electrode and the second electrode is determined depending on the conductivity type of an underlying layer for forming the first electrode or the second electrode, or depending on the light-emitting direction. For example, in the case where the conductivity type of the underlying layer is p type, examples of the material for each electrode include silver (including silver alloys containing In, Cu, Pd, Ni, Co, Rh, or Pt), Ti/Au, and Cr/Au. In the case where the conductivity type of the underlying layer is n type, examples of the material for each electrode include titanium (Ti), titanium alloys, such as TiW and TiMo, (e.g., TiW layer and Ti layer/Ni layer/Au layer), aluminum (Al) and aluminum alloys, AuGe, and AuGe/Ni/Au. Depending on the material constituting the substrate used, the first electrode may be formed on the back face of the substrate or may be formed on a portion of the first compound semiconductor layer exposed during the formation of the mesa structure. When a transparent electrode is used, the electrode may be composed of ITO. Note that when the electrode has a layered structure, a material shown before the slash "/" is located on the substrate side. Furthermore, as necessary, a contact portion (pad portion) may be provided on the electrode, the contact portion (pad portion) being composed of a multilayered metal layer having a layer structure of [adhesive layer (such as Ti layer or Cr layer)]/[barrier metal layer (such as Pt layer, Ni layer, TiW layer, or Mo layer)]/[metal layer having good compatibility with mounting (such as Au layer)], for example, Ti layer/Pt layer/Au layer. The electrodes and the contact portion (pad portion) can be formed by any of various PVD methods, such as vacuum deposition and sputtering, various CVD methods, and plating.

In the first embodiment of the present invention, a wall structure is disposed outside a mesa structure so as to surround the mesa structure, and a second electrode is disposed on the top face of the wall structure. A second compound semiconductor layer in the wall structure is connected to a second compound semiconductor layer in the mesa structure through a second compound semiconductor layer in a bridge structure. A second electrode is not disposed on the second compound semiconductor layer in the mesa structure. Consequently, even if a large displacement occurs between a current constriction region disposed in the mesa structure and the second electrode, light from the active layer is not blocked by the second electrode provided on the top face of the wall structure.

In the second embodiment of the present invention, a second electrode is disposed on the top face of a protrusion located outside the edge of the top face of a second compound semiconductor layer constituting the mesa structure. Consequently, unlike in the related art, it is not always necessary to provide the second electrode in the shape of a ring on the periphery of the top face of the second compound semiconductor layer in the mesa structure. Therefore, even if a large displacement occurs between a current constriction region disposed in the mesa structure and the second electrode, a current can be reliably supplied from the second electrode to the second compound semiconductor layer in the mesa structure, and moreover, the possibility is low that light from the active layer is blocked by the second electrode provided outside the edge of the top face of the second compound semiconductor layer. Broadly speaking, the second embodiment of the present invention includes the first embodiment of the present invention. That is, depending on the shape of the protrusion in the second embodiment of the present invention, such a protrusion can have the same shape, configuration, and structure as those of the wall structure or the bridge structure in the first embodiment of the present invention.

Furthermore, in the third embodiment of the present invention, a plurality of point-like holes which reach at least an insulation region are disposed so as to extend in the lamination direction. Here, the formation of the insulation region starts from sidewalls of the holes, and each insulation region expands outward with the corresponding hole serving as a center. Consequently, the amount of the species to be used in insulating treatment, such as an oxidizing species, per unit area of the insulation region front decreases as the insulating treatment progresses, and thus the rate of the insulating treatment decreases. Therefore, even if the current constriction structure is small, it is possible to easily and accurately control the width of the current constriction region or the width of the insulation region. Moreover, since merely the plurality of point-like holes are formed, the formation of the current constriction region itself is easy. Consequently, it is possible to satisfy requirements for reduction in size of mesa structures and size of current constriction regions. At the same time, it is possible to provide the second electrode on the top face of the second compound semiconductor layer sufficiently apart from the space above the current constriction region so that light from the active layer is not blocked by the second electrode even if a large displacement occurs between the current constriction region and the second electrode disposed on the top face of the second compound semiconductor layer.

Furthermore, in any of the embodiments of the present invention, since the area of the second electrode to be provided on the top face of the second compound semiconductor layer can be decreased, it is possible to decrease a capacitance, i.e., parasitic capacitance, formed by the second electrode, the insulation region, and the first electrode.

BRIEF DESCRIPTION OF THE DRAWINGS

FIG. 12A is a schematic diagram of the second compound semiconductor layer viewed from above in a step, subsequent to the step illustrated in FIG. 11B, in the method for manufacturing the light-emitting element in Example 2, and FIG. 12B is a schematic diagram illustrating the relationship between a projection of an outer edge of a current constriction region and a projection of an outer edge of a portion of the top face of the second compound semiconductor layer in which a second electrode is not disposed in Example 2;

DESCRIPTION OF THE PREFERRED EMBODIMENTS

The embodiments of the present invention will be described based on examples with reference to the drawings.

Example 1

Figure 1A:
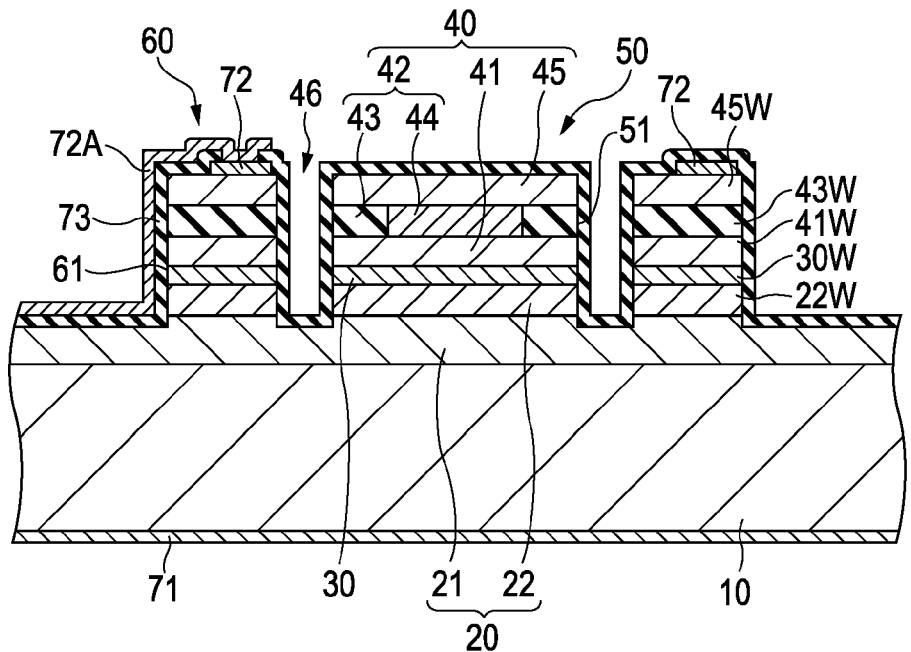
FIGS. 1A and 1B are a schematic partial cross-sectional view and a schematic partial plan view, respectively, of a light-emitting element in Example 1.
Figure 1B:
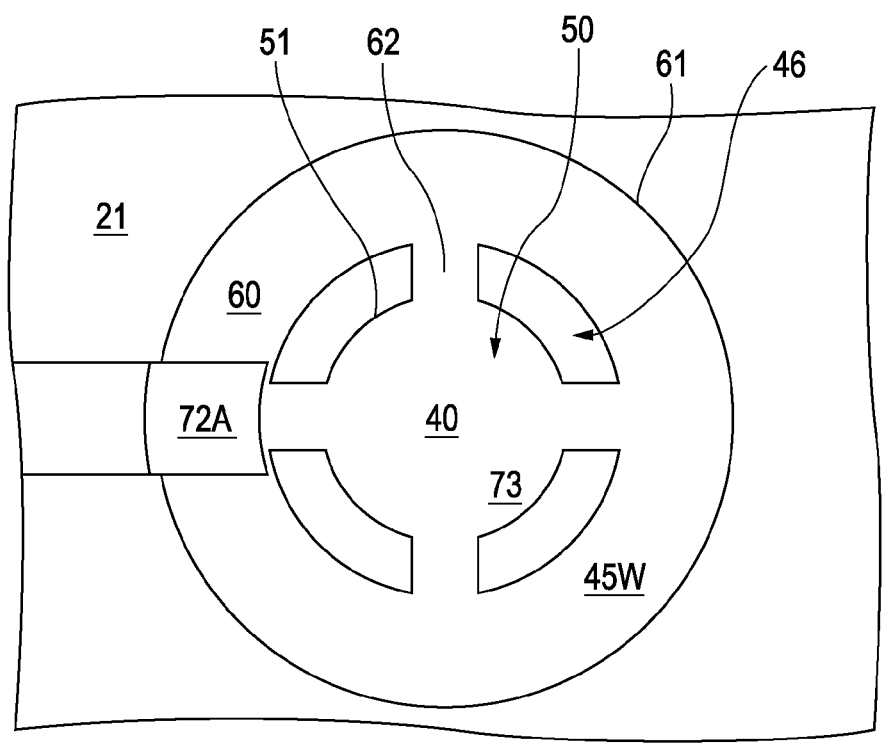

Example 1 relates to a light-emitting element according to the first embodiment of the present invention and a method for manufacturing the light-emitting element according to the first embodiment. FIGS. 1A and 1B are a schematic partial cross-sectional view and a schematic partial plan view, respectively, of a light-emitting element in Example 1. Note that in Example 1 or Example 2 or 3, which will be described later, the first conductivity type is n type, and the second conductivity type is p type. Furthermore, in Example 1 or Examples 2 or 3, which will be described later, the light-emitting element is a surface-emitting laser element (vertical cavity surface-emitting laser; VCSEL) in which light is emitted through a second compound semiconductor layer.

The light-emitting element of Example 1 has a mesa structure 50 in which a first compound semiconductor layer 20 of the first conductivity type (n type), an active layer 30, and a second compound semiconductor layer 40 of the second conductivity type (p type) are disposed in that order (specifically, disposed in that order on a substrate 10). At least one of the first compound semiconductor layer 20 and the second compound semiconductor layer 40 (specifically, in Example 1, the second compound semiconductor layer 40) has a current constriction region 44 surrounded by an insulation region 43 extending inward from a sidewall portion 51 of the mesa structure 50. The light-emitting element includes a second electrode (p-side electrode) 72, a second electrode extending portion 72A, and a first electrode (n-side electrode) 71 electrically connected to the first compound semiconductor layer 20.

In the light-emitting element of Example 1, a wall structure 60 is disposed so as to surround the mesa structure 50, the wall structure 60 having the same layer structure as a portion of the mesa structure 50 in which the insulation region 43 is provided. That is, in the light-emitting element of Example 1, the wall structure 60 having the same configuration as the portion of the mesa structure 50 in which the insulation region 43 is provided is disposed separately from and outside the mesa structure 50. Reference numeral 46 represents a gap (groove) provided between the wall structure 60 and the mesa structure 50. The mesa structure 50 and the wall structure 60 are connected with each other by at least one bridge structure 62 having the same layer structure as the portion of the mesa structure 50 in which the insulation region 43 is provided. That is, the mesa structure 50 and the wall structure 60 are connected with each other by at least one bridge structure 62 having the same configuration as the portion of the mesa structure 50 in which the insulation region 43 is provided. Furthermore, an insulating layer 73 is disposed at least on an outer side face 61 of the wall structure 60 and an exposed first compound semiconductor layer 20 (more specifically, exposed first DBR layer 21). The second electrode 72 is disposed on a top face of the wall structure 60 (more specifically, continuously disposed on a part of the top face of the wall structure 60). The second electrode extending portion 72A extends from the second electrode 72 over the insulating layer 73 provided on the outer side face 61 of the wall structure 60 to a lower end of the wall structure 60 and further onto the insulating layer 73 provided on the first compound semiconductor layer 20.

More specifically, in the light-emitting element in Example 1 or Example 2 or 3, which will be described later, the mesa structure 50 includes the first compound semiconductor layer 20, the active layer 30, and the second compound semiconductor layer 40 disposed on the substrate 10 which is an n-type GaAs substrate. The first compound semiconductor layer 20 has a layered structure including a first DBR layer 21 and a first cladding layer 22, each having a composition shown in Table 1 below, disposed in that order from the substrate side. The active layer 30 in the mesa structure 50 has a multiple quantum well structure having a composition shown in Table 1. Furthermore, the second compound semiconductor layer 40 in the mesa structure 50 has a layered structure including a lower layer (second cladding layer) 41, a middle layer (current constriction layer) 42, and an upper layer (second DBR layer) 45, each having a composition shown in Table 1, disposed in that order from the substrate side. The middle layer (current constriction layer) 42 includes the insulation region 43 extending from the sidewall portion 51 of the mesa structure 50 toward the center of the mesa structure 50, and the current constriction region 44 surrounded by the insulation region 43. Note that the planar shape of the current constriction region 44 affects, for example, the far-field pattern (FFP), the transverse mode, and the longitudinal mode.

TABLE 1

| Second compound semiconductor layer 40 | |
| --- | --- |
| Upper layer (Second DBR layer) 45 | DBR layer in which p-$Al_{0.9}Ga_{0.1}As$ layers and p-$Al_{0.1}Ga_{0.9}As$ layers are alternately disposed |
| Middle layer (Current constriction layer) 42 | p-AlAs |
| Lower layer (Second cladding layer) 41 | p-$Al_{0.3}Ga_{0.7}As$ |
| Active layer 30 | i-GaAs/$Al_{0.3}Ga_{0.7}As$ |
| First compound semiconductor layer 20 | |
| First cladding layer 22 | n-$Al_{0.3}Ga_{0.7}As$ |
| First DBR layer 21 | DBR layer in which n-$Al_{0.9}Ga_{0.1}As$ layers and n-$Al_{0.1}Ga_{0.9}As$ layers are alternately disposed |

As described above, the wall structure 60 has the same layer structure as the portion of the mesa structure 50 in which the insulation region 43 is provided. That is, the wall structure 60 includes a first compound semiconductor layer, an active layer, and a second compound semiconductor layer disposed in that order from the substrate side. A first compound semiconductor layer 20 and an active layer 30W constituting the wall structure 60 respectively have the same configuration and structure as the first compound semiconductor layer 20 and the active layer 30 constituting the mesa structure 50. On the other hand, a second compound semiconductor layer constituting the wall structure 60 has a layered structure in which a lower layer (second cladding layer) 41W, a middle layer 42W, and an upper layer (second DBR layer) 45W are disposed in that order from the substrate side. The middle layer (current constriction layer) 42W is composed of an insulation region 43W. The lower layer (second cladding layer) 41W and the upper layer (second DBR layer) 45W constituting the wall structure 60 respectively have the same configuration and structure as the lower layer (second cladding layer) 41 and the upper layer (second DBR layer) 45 constituting the mesa structure 50.

As described above, the bridge structure 62 also has the same layer structure as the portion of the mesa structure 50 in which the insulation region 43 is provided. That is, the bridge structure 62 has a structure in which a first compound semiconductor layer of the first conductivity type, an active layer, and a second compound semiconductor layer of the second conductivity type are disposed in that order (specifically, disposed in that order on the substrate 10), and an insulation region 43B is disposed in a part of the second compound semiconductor layer. Specifically, the bridge structure 62 has the same configuration and structure as the wall structure 60.

A pad portion (not shown) is disposed on the second electrode extending portion 72A above the exposed first compound semiconductor layer 20. On the other hand, the first electrode (n-side electrode) 71 is disposed on the back face of the substrate 10. The first electrode 71 is composed of an AuGe alloy layer and connected to the first compound semiconductor layer 20 through the substrate 10. Each of the second electrode 72 and the second electrode extending portion 72A has a layered structure of Ti layer/Au layer. The pad portion has a layered structure of Ti layer/Pt layer/Au layer. The insulating layer 73 is composed of, for example, $SiO_2$. The same applies to the light-emitting element in Example 2 or 3 which will be described later.

Here, the interface between the second compound semiconductor layer 40 and the active layer 30 is equivalent to the interface between the first compound semiconductor layer 20 and the active layer 30, and is also equivalent to the surface of the substrate (hereinafter referred to as the "surface of the substrate"). In a phantom cross-section of the wall structure 60 taken parallel to the surface of the substrate, the cross-sectional shape of the wall structure 60 is annular, and in a phantom cross-section of the mesa structure 50 taken parallel to the surface of the substrate, the cross-sectional shape of the mesa structure 50 is circular. More specifically, provided that $W_W$ is the width of the insulation region 43W in the wall structure 60 in a phantom cross-section of the wall structure 60 taken parallel to the surface of the substrate, and that $W_I$ is the width of the insulation region 43 in the mesa structure 50 in a phantom cross-section of the mesa structure 50 taken parallel to the surface of the substrate, for example, the value $W_W$ is set at 5 μm and the value $W_I$ is set at 5 μm (double this, i.e., 10 μm, in the entire mesa structure 50). Therefore, $W_W/W_I=1$. Furthermore, provided that $W_B$ is the width of the insulation region 43B in the bridge structure 62 in a phantom cross-section of the bridge structure 62 taken parallel to the surface of the substrate, for example, the value $W_B$ is set at 10 μm. Therefore, $W_B/W_I=2$. Furthermore, in a phantom cross-section of the insulation regions 43 and 43W of the mesa structure 50 and the wall structure 60, respectively, taken parallel to the surface of the substrate, the minimum value of the shortest distance between the mesa structure 50 and the wall structure 60 (i.e., the minimum value $D_{MW}$ of the width of the gap 46) is 2.5 μm because a variation may occur in the distance between the mesa structure 50 and the wall structure 60. That is, in a phantom cross-section of the wall structure 60 taken parallel to the surface of the substrate, the cross-sectional shape of the wall structure 60 is annular (outside diameter 40 μm, inside diameter 30 μm), and in a phantom cross-section of the mesa structure 50 taken parallel to the surface of the substrate, the cross-sectional shape of the mesa structure 50 is circular (diameter 20 μm). Furthermore, in Example 1, the number of bridge structures 62 is four, and the bridge structures 62 are arranged on the vertices of a phantom square.

Figure 3A:
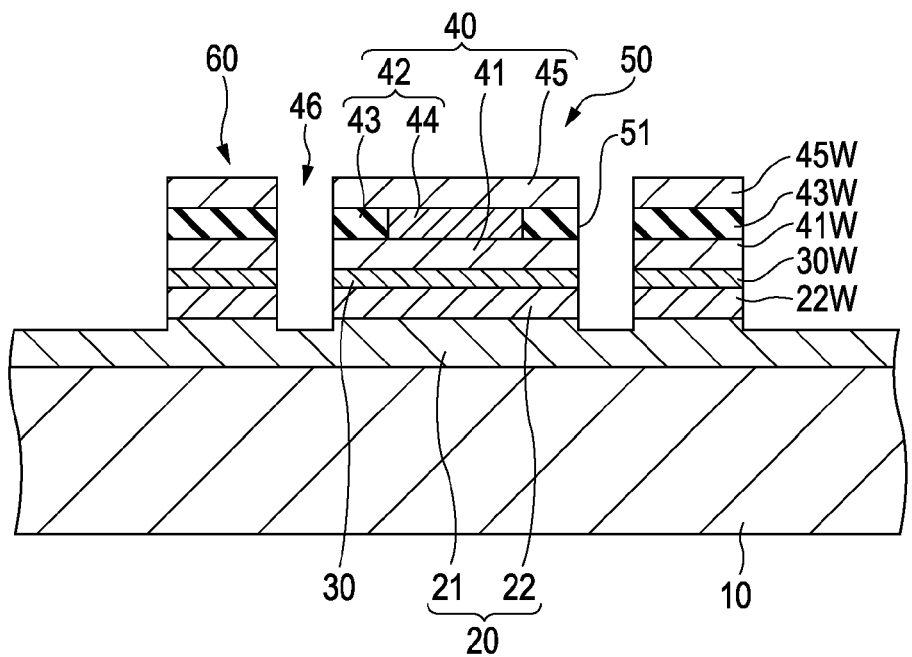
FIGS. 3A and 3B are each a schematic partial cross-sectional view of the substrate, etc. for illustrating a step, subsequent to the step illustrated in FIG. 2B, in the method for manufacturing the light-emitting element in Example 1.
Figure 3B:
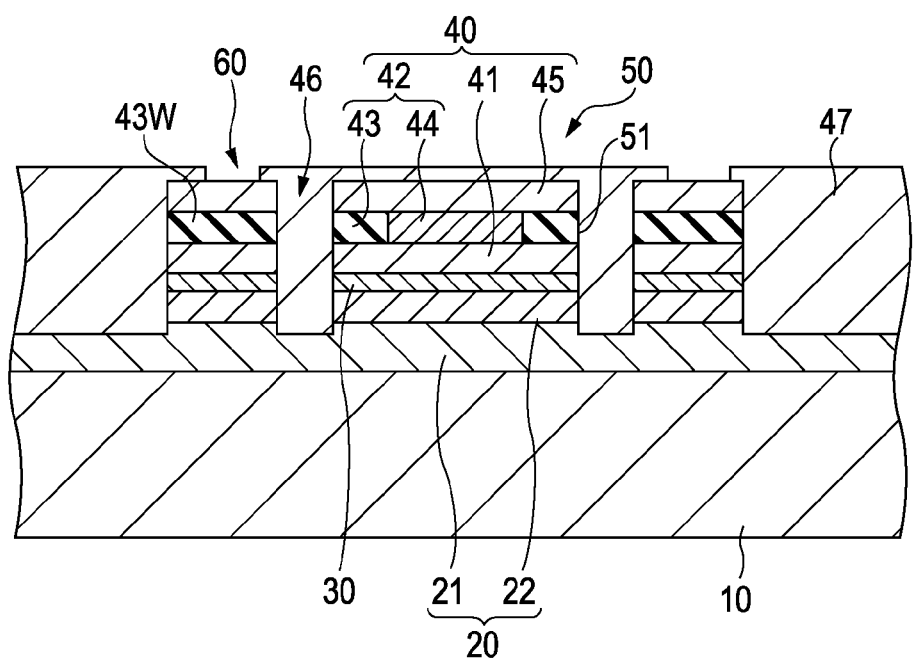
Figure 4A:
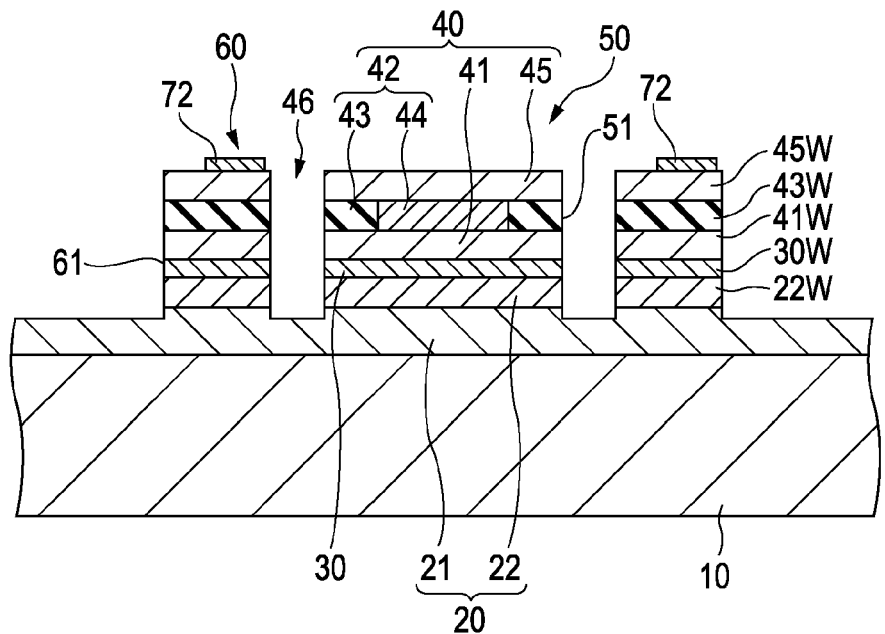
FIGS. 4A and 4B are each a schematic partial cross-sectional view of the substrate, etc. for illustrating a step, subsequent to the step illustrated in FIG. 3B, in the method for manufacturing the light-emitting element in Example 1.
Figure 4B:
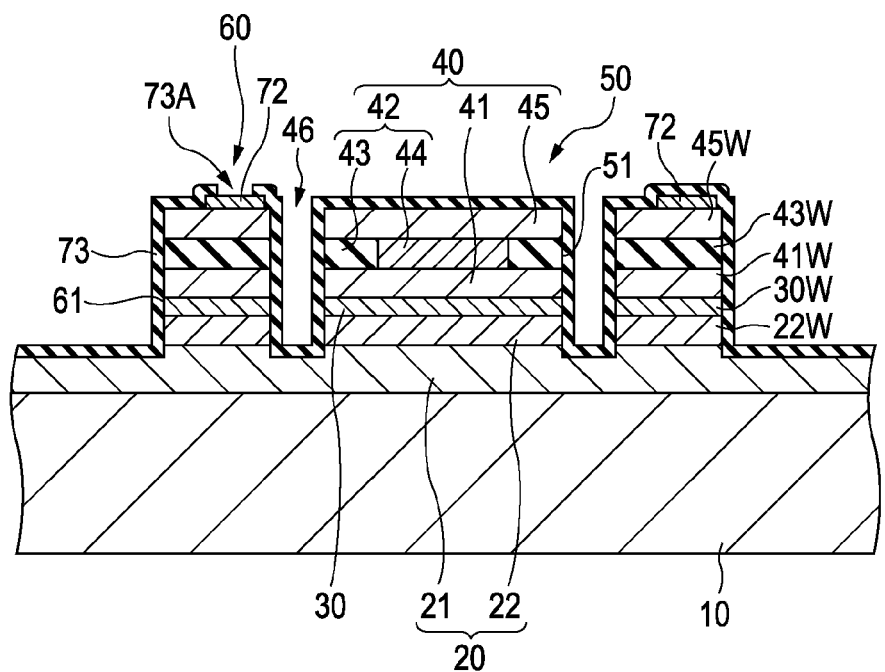
Figure 5:
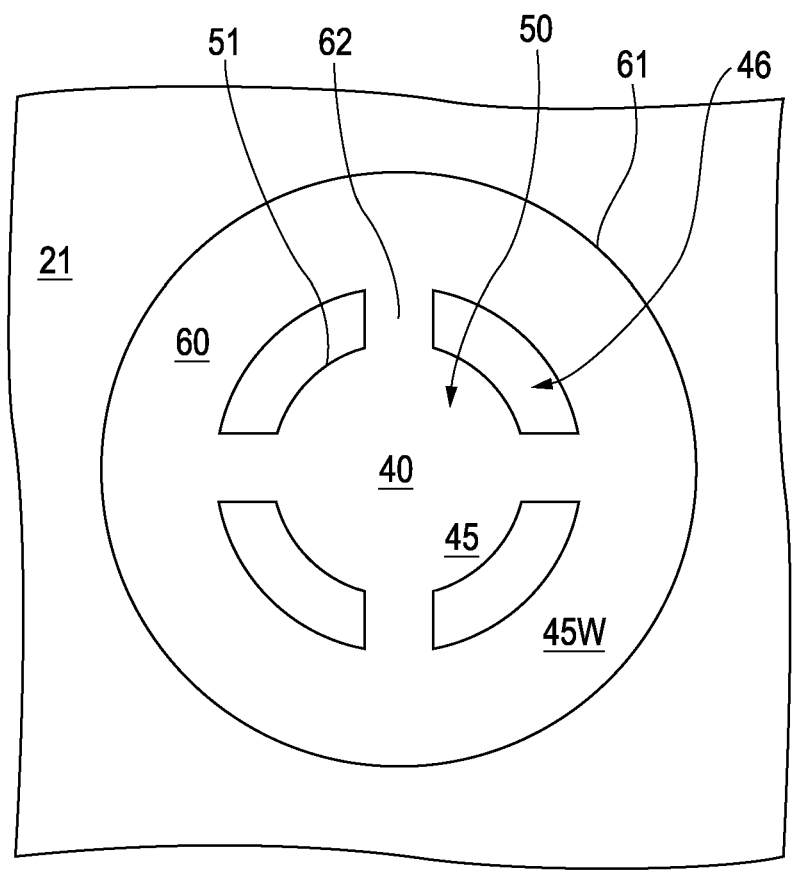
FIG. 5 is a schematic diagram of a second compound semiconductor layer viewed from above in a step in the method for manufacturing the light-emitting element in Example 1.
Figure 6:
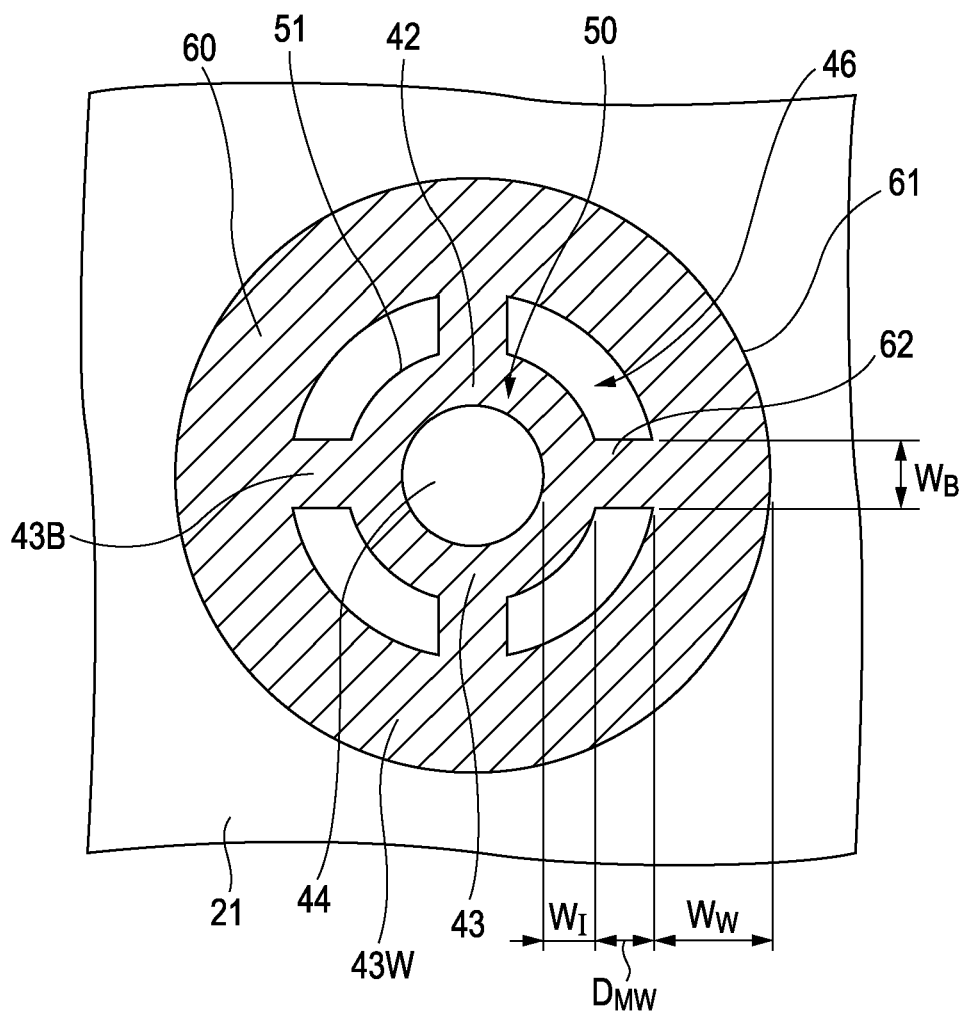
FIG. 6 is a schematic phantom cross-sectional view of a middle layer taken parallel to the principal surface of the substrate, illustrating a state of the middle layer after insulating treatment in a step, subsequent to the step illustrated in FIG. 5, in the method for manufacturing the light-emitting element in Example 1.
Figure 7:
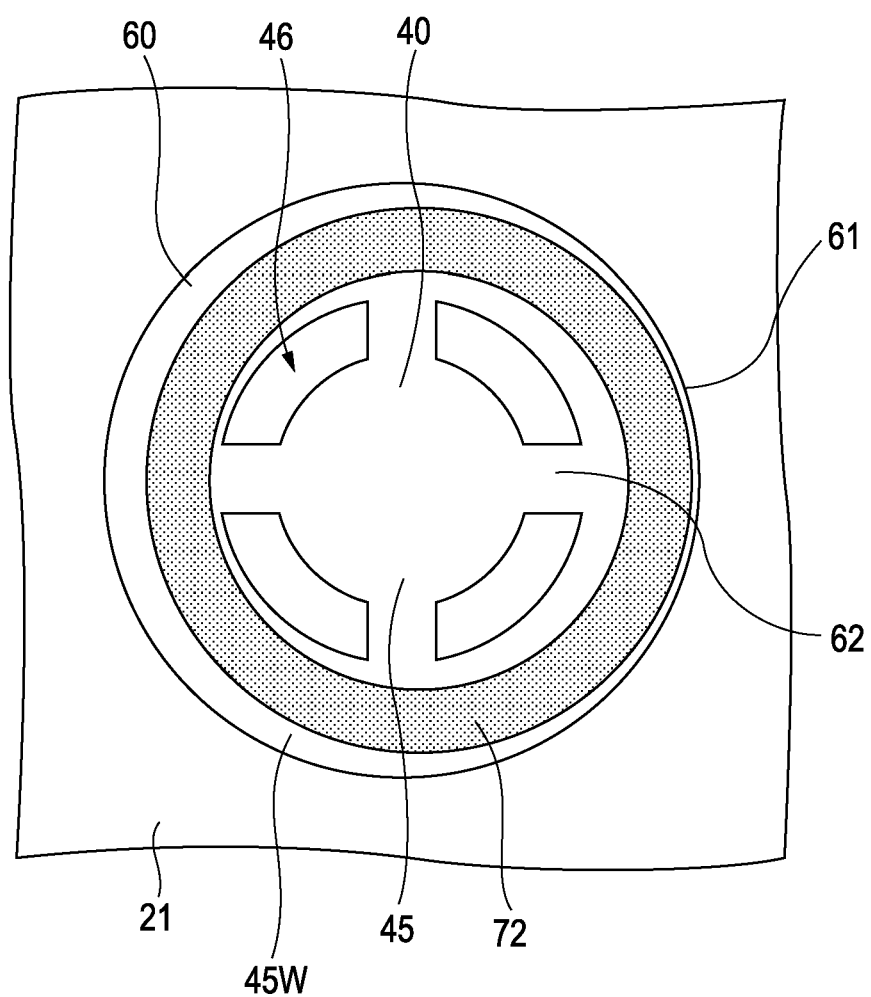
FIG. 7 is a schematic diagram of the second compound semiconductor layer viewed from above in a step, subsequent to the step illustrated in FIG. 6, in the method for manufacturing the light-emitting element in Example 1.

A method for manufacturing a light-emitting element of Example 1 will be outlined below with reference to FIGS. 2A, 2B, 3A, 3B, 4A, and 4B which are each a schematic partial cross-sectional view of a substrate, etc., FIGS. 5 and 7 which are each a schematic diagram of a second compound semiconductor layer viewed from above, and FIG. 6 which is a schematic phantom cross-sectional view of a middle layer 42 taken parallel to the principal surface of the substrate 10. The individual layers can be formed, for example, by MOCVD. In such a case, as the starting material for a group III-V compound semiconductor, for example, trimethylaluminum (TMA), trimethylgallium (TMG), or arsine ($AsH_3$) is used. As the source for a donor impurity, for example, $H_2Se$ is used. As the source for an acceptor impurity, for example, dimethyl zinc (DMZ) is used. Furthermore, the individual layers can be etched, for example, by a dry etching technique using a chlorine-based gas. The same applies to the light-emitting element in Example 2 or 3 which will be described later.

[Step-100]

Figure 2A:
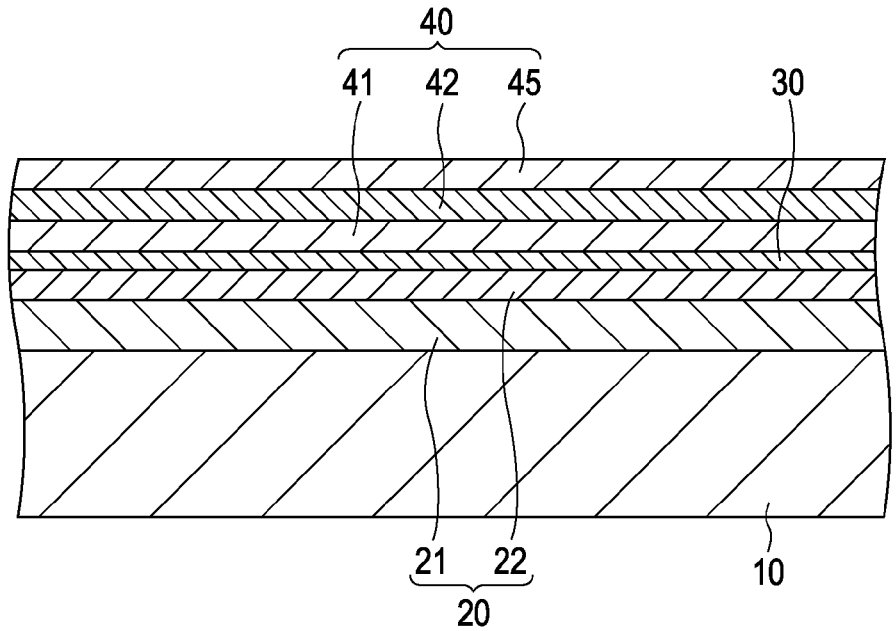
FIGS. 2A and 2B are each a schematic partial cross-sectional view of a substrate, etc. for illustrating a step in a method for manufacturing the light-emitting element in Example 1.

First, using known MOCVD, a first compound semiconductor layer 20 of a first conductivity type (specifically, n type) including a first DBR layer 21 and a first cladding layer 22, an active layer 30, and a second compound semiconductor layer 40 of a second conductivity type (specifically, p type) including a lower layer (second cladding layer) 41, a middle layer (current constriction layer) 42, and an upper layer (second DBR layer) 45, are formed (deposited) in that order on a principal surface of a substrate 10 composed of n-GaAs (refer to FIG. 2A).

[Step-110]

Figure 2B:
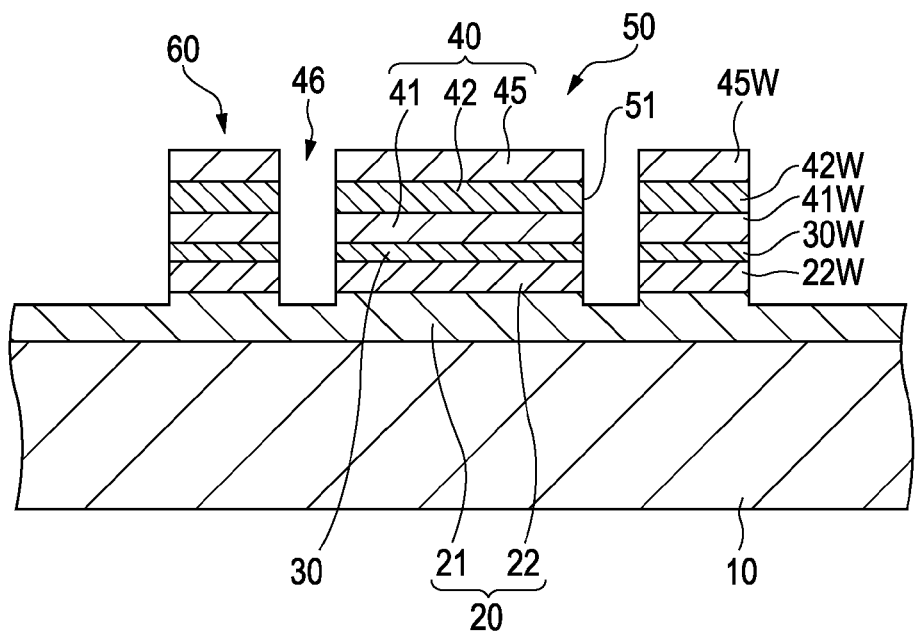

Then, by selectively removing a part of at least the second compound semiconductor layer 40 and the active layer 30, the first compound semiconductor layer 20 is partially exposed. FIG. 2B is a schematic partial cross-sectional view and FIG. 5 is a schematic partial plan view in this state. Specifically, using lithography and dry etching, the first compound semiconductor layer 20 is partially exposed by selectively removing a part of the second compound semiconductor layer 40 and the active layer 30, and further a part of the first compound semiconductor layer 20 in the thickness direction, except for portions where a mesa structure 50 is to be formed and a wall structure 60 and a bridge structure 62 are to be formed. In such a manner, it is possible to obtain (1) the mesa structure 50 in which the first compound semiconductor layer 20, the active layer 30 and the second compound semiconductor layer 40 are disposed in that order (specifically, disposed in that order on the substrate 10) and remains like an island in the shape of a column (e.g., circular cylindrical or columnar), (2) the wall structure 60 having the same layer structure as the mesa structure 50 and disposed so as to surround the mesa structure 50 (i.e., the wall structure 60 located outside and separately from the mesa structure 50 and having the same configuration as the mesa structure 50), and (3) at least one bridge structure 62 having the same layer structure as the mesa structure 50 and connecting the mesa structure 50 and the wall structure 60 (i.e., at least one bridge structure 62 having the same configuration as the mesa structure 50 and connecting the mesa structure 50 and the wall structure 60). At this point, more specifically, the mesa structure 50, the wall structure 60, and the bridge structure 62 each have a structure including a part of the first compound semiconductor layer 20, the active layer 30, and the second compound semiconductor layer 40 disposed in that order from the bottom.

[Step-120]

Next, insulating treatment is performed on a part of at least one of the first compound semiconductor layer 20 and the second compound semiconductor layer 40 constituting the mesa structure 50, specifically on a part of the second compound semiconductor layer 40 constituting the mesa structure 50, from the sidewall portion 51 of the mesa structure 50 to form an insulation region 43, an outer edge of which extends to the sidewall portion 51 of the mesa structure 50. Specifically, the substrate 10 is exposed to, for example, an air atmosphere containing 1% by volume of water vapor at a temperature of 100° C. As a result, the middle layer 42 composed of AlAs begins to be oxidized by water vapor from the sidewall portion 51 of the mesa structure 50. Although the sidewall portion 51 of the mesa structure 50 in the other compound semiconductor layers is exposed to water vapor, the rate of oxidation is significantly lower than that of the middle layer 42 composed of AlAs. For example, by continuing the exposure to such an atmosphere for 10 minutes, it is possible to obtain a current constriction region 44 surrounded by the insulation region 43 in the middle layer 42 of the second compound semiconductor layer 40. At the same time, insulation treatment is performed on at least one of the first compound semiconductor layer and the second compound semiconductor layer (specifically, on the second compound semiconductor layer 40) in each of the wall structure 60 and the bridge structure 62 from a side face of the wall structure 60 or the bridge structure 62 to form each of insulation regions 43W and 43B. FIG. 3A is a schematic partial cross-sectional view showing a state where the formation of the insulation regions 43, 43W, and 43B is completed. FIG. 6 is a schematic phantom cross-sectional view of the middle layer 42 taken parallel to the principal surface of the substrate 10. In FIG. 6, in order to clearly show the insulation regions 43, 43W, and 43B, the insulation regions 43, 43W, and 43B are hatched.

[Step-130]

Next, for example, using a lift-off technique and vapor deposition, a ring-like second electrode (p-side electrode) 72 is formed on a top face of the second compound semiconductor layer constituting the wall structure 60. Specifically, a resist layer 47 is formed such that a portion of the top face of the second compound semiconductor layer on which the second electrode (p-side electrode) 72 is to be formed (i.e. a portion of the upper layer 45W) is exposed (refer to FIG. 3B). Then, a layered structure of Ti layer/Au layer is formed by vacuum deposition, followed by removal of the resist layer 47. FIG. 4A is a schematic partial cross-sectional view and FIG. 7 is a schematic partial plan view each showing the resulting state. FIGS. 4A and 7 show a state in which a misalignment of a photomask has occurred during the formation of the second electrode 72.

[Step-140]

Subsequently, an insulating layer 73 is formed on at least the outer side face 61 of the wall structure 60 and the exposed first compound semiconductor layer 20 (more specifically, the exposed first DBR layer 21). Specifically, in Example 1, for example, using CVD and etching, an insulating layer 73, for example, composed of $SiO_2$, is formed on the mesa structure 50, the wall structure 60, the bridge structure 62, the exposed first compound semiconductor layer 20, and the second electrode (p-side electrode) 72. Then, an opening 73A is formed by removing the insulating layer 73 located on a part of the second electrode (p-side electrode) 72 (refer to FIG. 4B).

[Step-150]

Subsequently, for example, using a lift-off technique and vacuum deposition, a second electrode extending portion 72A is formed so as to extend from the second electrode 72 over the insulating layer 73 disposed on the outer side face 61 of the wall structure 60 onto the insulating layer 73 disposed on the first compound semiconductor layer 20. Next, a pad portion (not shown) is formed on a portion of the second electrode extending portion 72A located above the first compound semiconductor layer 20. Then, a first electrode (n-side electrode 71) is formed on the back face of the substrate 10. The first electrode (n-side electrode 71) is connected to the first compound semiconductor layer 20 through the substrate 10. Next, after alloying treatment is performed, a light-emitting element is separated (isolated), for example, by dicing, and thereby the light-emitting element of Example 1 shown in FIGS. 1A and 1B can be obtained.

In Example 1, the wall structure 60 is disposed so as to surround the mesa structure 50, the wall structure 60 having the same layer structure as the portion of the mesa structure 50 in which the insulation region 43 is provided. The mesa structure 50 and the wall structure 60 are connected by at least one bridge structure 62 having the same layer structure as the portion of the mesa structure 50 in which the insulation region 43 is provided. That is, the wall structure 60 is disposed outside and separately from the mesa structure 50, and the second electrode 72 is disposed on the top face of the wall structure 60. The second compound semiconductor layer in the wall structure 60 is connected to the second compound semiconductor layer in the mesa structure 50 through the second compound semiconductor layer in the bridge structure 62. A second electrode is not disposed on the second compound semiconductor layer 40 in the mesa structure 50. Consequently, even if a large displacement occurs between the current constriction region 44 disposed in the mesa structure 50 and the second electrode 72, light from the active layer 30 is not blocked by the second electrode 72 provided on the top face of the wall structure 60. Furthermore, since the area of the second electrode 72 to be provided on the top face of the second compound semiconductor layer can be decreased, it is possible to decrease a capacitance, i.e., parasitic capacitance, formed by the second electrode 72, the insulation region 43W, and the first electrode 71.

Example 2

Figure 8A:
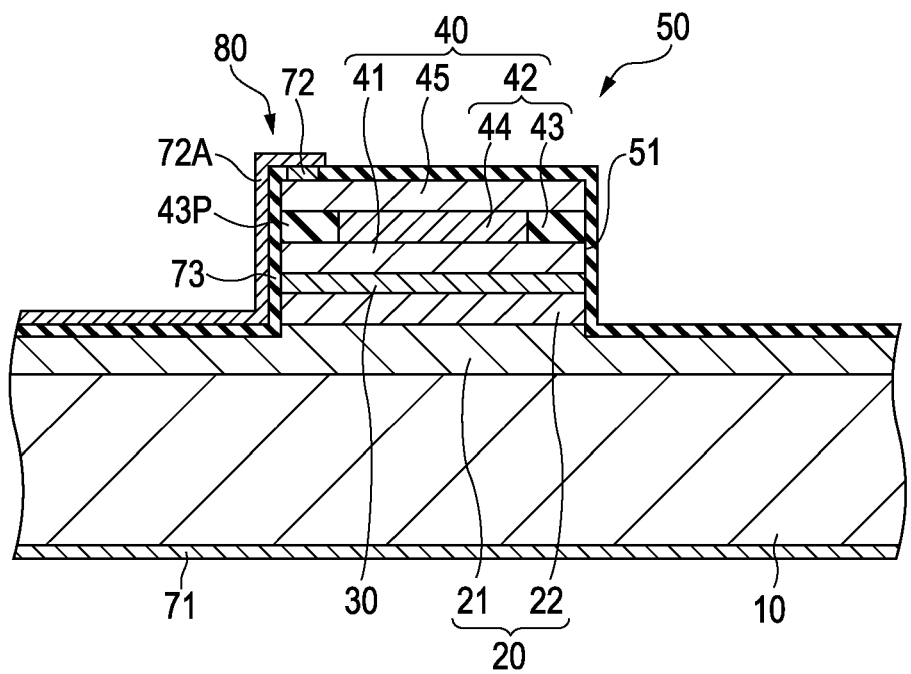
FIGS. 8A and 8B are a schematic partial cross-sectional view and a schematic partial plan view, respectively, of a light-emitting element in Example 2.
Figure 8B:
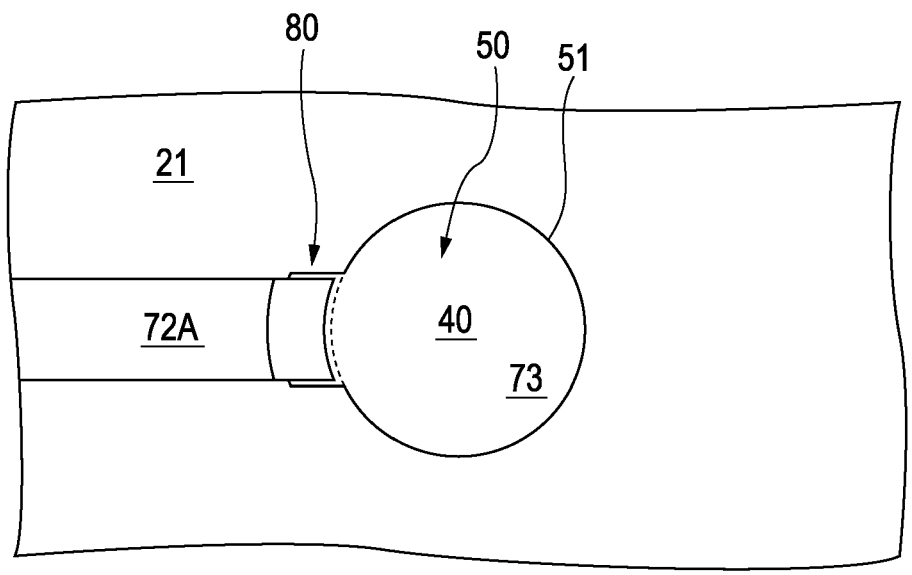

Example 2 relates to a light-emitting element according to the second embodiment of the present invention and a method for manufacturing the light-emitting element according to the second embodiment. FIGS. 8A and 8B are a schematic partial cross-sectional view and a schematic partial plan view, respectively, of a light-emitting element in Example 2.

As in Example 1, the light-emitting element of Example 2 has a mesa structure in which a first compound semiconductor layer 20 of the first conductivity type (n type), an active layer 30, and a second compound semiconductor layer 40 of the second conductivity type (p type) are disposed in that order. At least one of the first compound semiconductor layer 20 and the second compound semiconductor layer 40 has a current constriction region 44 surrounded by an insulation region 43 extending inward from a sidewall portion 51 of the mesa structure 50. Specifically, as in Example 1, the light-emitting element of Example 2 has the mesa structure 50 in which the first compound semiconductor layer 20 of the first conductivity type (n type), the active layer 30, and the second compound semiconductor layer 40 of the second conductivity type (p type) are disposed in that order on a substrate 10, and the current constriction region 44 surrounded by the insulation region 43 is disposed in the form of a layer in a part of the second compound semiconductor layer 40. An outer edge of the insulation region 43 extends to the sidewall portion 51 of the mesa structure 50, and the first compound semiconductor layer 20 is partially exposed. The light-emitting element further includes a second electrode (p-side electrode) 72, a second electrode extending portion 72A, and a first electrode (n-side electrode) 71 electrically connected to the first compound semiconductor layer 20.

In the light-emitting element of Example 2, an insulating layer 73 is disposed at least on the sidewall portion 51 of the mesa structure 50 and the exposed first compound semiconductor layer 20 (more specifically, on an exposed first DBR layer 21). At least one protrusion 80 having the same layer structure as a portion of the mesa structure 50 in which the insulation region 43 is provided protrudes from the sidewall portion 51 of the mesa structure 50. The second electrode (p-side electrode) 72 is disposed on a top face of the protrusion 80 and electrically connected to the second compound semiconductor layer 40. Specifically, at least one protrusion 80 is disposed on the sidewall portion 51 of the mesa structure 50 so as to extend from the upper end to the lower end of the sidewall portion 51 of the mesa structure 50. Furthermore, the second electrode extending portion 72A extends from the second electrode 72 over the insulating layer 73 disposed on the side face of the protrusion 80 provided on the sidewall portion 51 of the mesa structure 50 onto the insulating layer 73 disposed on the first compound semiconductor layer 20.

In the light-emitting element of Example 2, specifically, the second electrode 72 is disposed on an edge of the top face of the second compound semiconductor layer 40 corresponding to the top face of the protrusion 80. Furthermore, the shape of the protrusion 80 in a phantom cross-section of the protrusion 80 taken parallel to the surface of the substrate is a sector. Furthermore, in Example 2, the number of protrusions 80 is one. Furthermore, the relationship $S_{Conf}/S_{E2}<1$ is satisfied, wherein $S_{Conf}$ is the area of the current constriction region 44 and $S_{E2}$ is the area of the top face of the second compound semiconductor layer 40 constituting the mesa structure 50. Furthermore, the projection of the outer edge of the current constriction region 44 is contained in the projection of the outer edge of the top face of the second compound semiconductor layer 40 constituting the mesa structure 50. Furthermore, the minimum value of the shortest distance between the projection of the outer edge of the current constriction region 44 and the projection of the outer edge of the top face of the second compound semiconductor layer 40 constituting the mesa structure 50 is $1\times10^{-6}$ m. FIG. 12B is a schematic diagram illustrating the relationship between the projection of the outer edge of the current constriction region 44 and the projection of the outer edge of the top face of the second compound semiconductor layer 40 constituting the mesa structure 50. In FIG. 12B, the projection of the outer edge of the current constriction region 44 is indicated by lines slanting from the upper right to the lower left, and the projection of the outer edge of the portion of the top face of the second compound semiconductor layer 40 where the second electrode 72 is not provided is indicated by lines slanting from the upper left to the lower right.

Figure 9A:
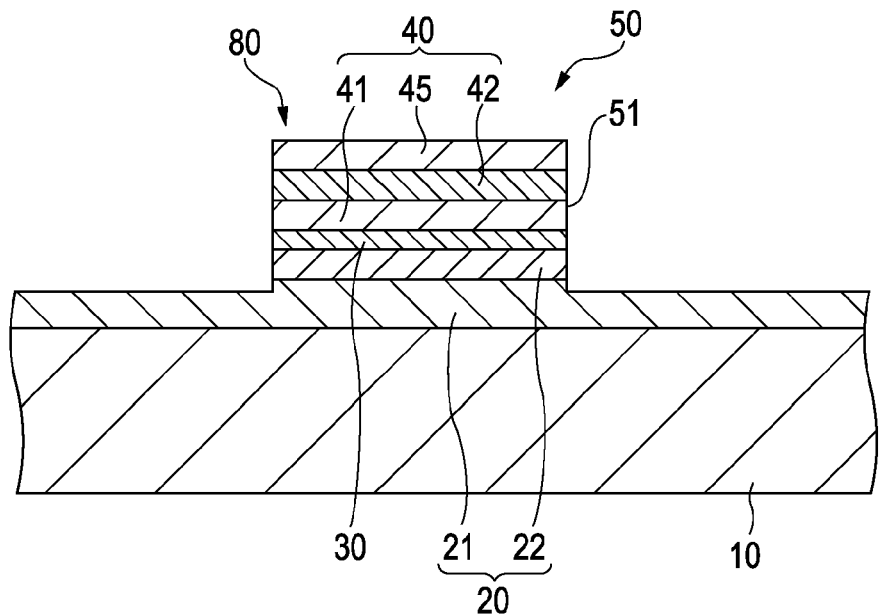
FIGS. 9A and 9B are each a schematic partial cross-sectional view of a substrate, etc. for illustrating a step in a method for manufacturing the light-emitting element in Example 2.
Figure 9B:
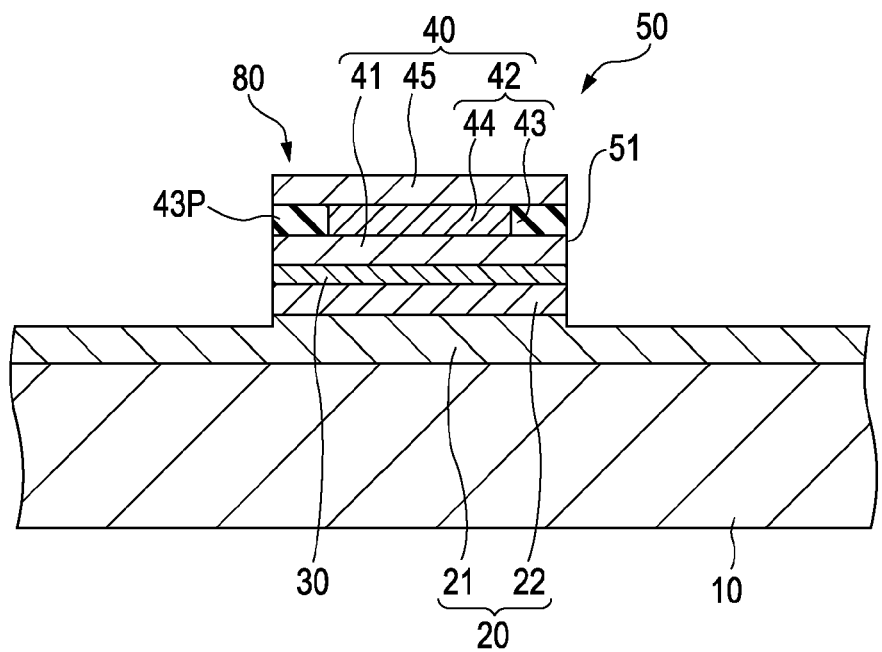
Figure 10A:
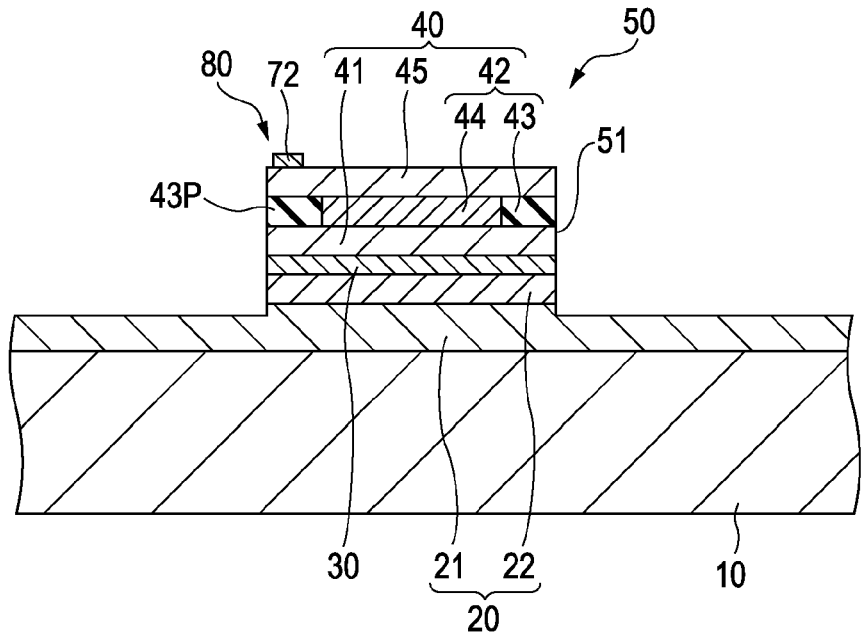
FIGS. 10A and 10B are each a schematic partial cross-sectional view of the substrate, etc. for illustrating a step, subsequent to the step illustrated in FIG. 9B, in the method for manufacturing the light-emitting element in Example 2.
Figure 10B:
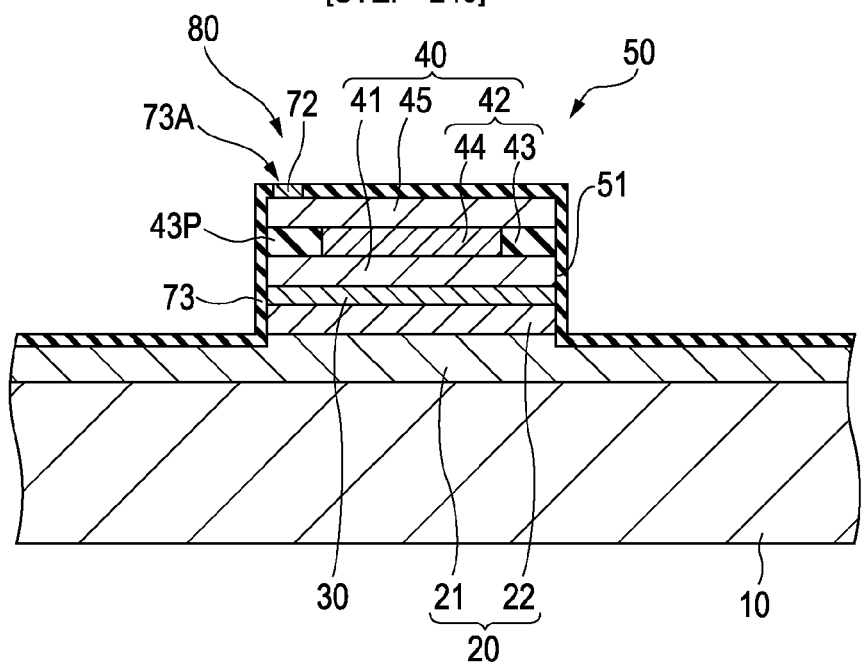
Figure 11A:
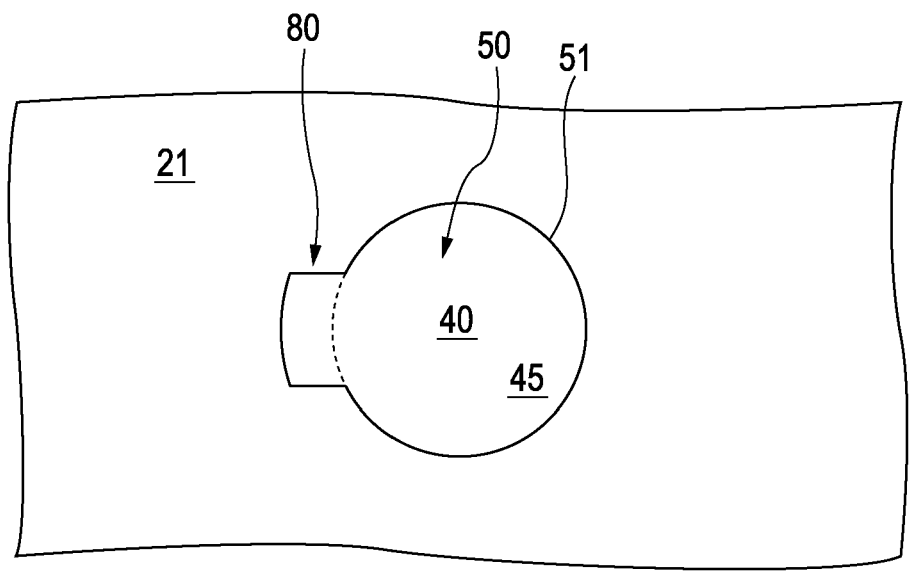
FIG. 11A is a schematic diagram of a second compound semiconductor layer viewed from above in a step in the method for manufacturing the light-emitting element in Example 2.
Figure 11B:
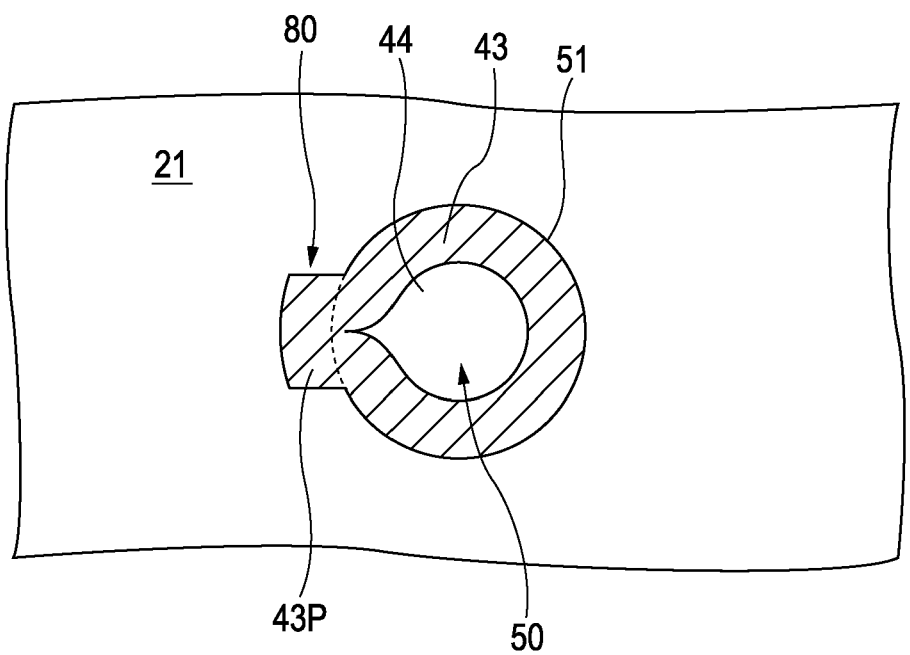
FIG. 11B is a schematic phantom cross-sectional view of a middle layer taken parallel to the principal surface of the substrate, illustrating a state of the middle layer after insulating treatment.

A method for manufacturing a light-emitting element of Example 2 will be outlined below with reference to FIGS. 9A, 9B, 10A, and 10B which are each a schematic partial cross-sectional view of a substrate, etc., FIGS. 11A and 12A which are each a schematic diagram of a second compound semiconductor layer viewed from above, and FIG. 11B which is a schematic phantom cross-sectional view of a middle layer 42 taken parallel to the principal surface of the substrate 10.

[Step-200]

First, as in Step-100 in Example 1, using known MOCVD, a first compound semiconductor layer 20 of a first conductivity type (specifically, n type) including a first DBR layer 21 and a first cladding layer 22, an active layer 30, and a second compound semiconductor layer 40 of a second conductivity type (specifically, p type) including a lower layer (second cladding layer) 41, a middle layer (current constriction layer) 42, and an upper layer (second DBR layer) 45, are formed (deposited) in that order on a principal surface of a substrate 10 composed of n-GaAs (refer to FIG. 2A).

[Step-210]

Then, as in step-110 in Example 1, by selectively removing a part of at least the second compound semiconductor layer 40 and the active layer 30, the first compound semiconductor layer 20 is partially exposed. FIG. 9A is a schematic partial cross-sectional view and FIG. 11A is a schematic partial plan view in this state. Specifically, using lithography and dry etching, the first compound semiconductor layer 20 is partially exposed by selectively removing a part of the second compound semiconductor layer 40 and the active layer 30, and further a part of the first compound semiconductor layer 20 in the thickness direction, except for portions where a mesa structure 50 and a protrusion 80 are to be formed. In such a manner, it is possible to obtain the mesa structure 50 in which the first compound semiconductor layer 20, the active layer 30, and the second compound semiconductor layer 40 are disposed in that order and at least one protrusion 80 extending from an upper end to a lower end of the sidewall portion 51 of the mesa structure 50 and having the same layer structure as the mesa structure 50. More specifically, each of the mesa structure 50 and the protrusion 80 includes a part of the first compound semiconductor layer 20, the active layer 30, and the second compound semiconductor layer 40 disposed in that order from the bottom. The mesa structure 50 is surrounded by the exposed first compound semiconductor layer 20.

[Step-220]

Next, insulating treatment is performed on a part of at least one of the first compound semiconductor layer 20 and the second compound semiconductor layer 40 constituting the mesa structure 50 and at least one of the first compound semiconductor layer 20 and the second compound semiconductor layer 40 constituting the protrusion 80 from the sidewall portion 51 of the mesa structure 50 and from a side face of the protrusion 80, respectively. Specifically, as in Step-120 in Example 1, insulating treatment is performed on a part of the second compound semiconductor layer 40 constituting the mesa structure 50 from the sidewall portion 51 of the mesa structure 50 to form an insulation region 43, an outer edge of which extends to the sidewall portion 51 of the mesa structure 50. At the same time, insulating treatment is performed on the second compound semiconductor layer 40 constituting the protrusion 80 from the side face of the protrusion 80 to form an insulation region 43P, an outer edge of which extends to the side face of the protrusion 80. In such a manner, it is possible to obtain a current constriction region 44 surrounded by the insulation region 43 in the second compound semiconductor layer 40. FIG. 9B is a schematic partial cross-sectional view showing a state where the formation of the insulation region 43 is completed. FIG. 11B is a schematic phantom cross-sectional view of the middle layer 42 taken parallel to the principal surface of the substrate 10. In FIG. 11B, in order to clearly show the insulation regions 43 and 43P, the insulation regions 43 and 43P are hatched. Here, the insulation region 43P indicates an insulation region formed in the protrusion 80.

[Step-230]

Next, as in Step-130 in Example 1, for example, using a lift-off technique and vapor deposition, a second electrode (p-side electrode) 72 is formed on a part of an edge of the top face of the second compound semiconductor layer 40 corresponding to the protrusion 80. Specifically, a resist layer is formed such that a portion of the top face of the second compound semiconductor layer 40 on which the second electrode (p-side electrode) 72 is to be formed (i.e. a portion of the upper layer 45 corresponding to the top face of the protrusion 80) is exposed. Then, a layered structure of Ti layer/Au layer is formed by vacuum deposition, followed by removal of the resist layer. FIG. 10A is a schematic partial cross-sectional view and FIG. 12A is a schematic partial plan view each showing the resulting state.

[Step-240]

Subsequently, as in Step-140 in Example 1, an insulating layer 73 is formed on at least the sidewall portion 51 of the mesa structure 50 and the exposed first compound semiconductor layer 20 (more specifically, the exposed first DBR layer 21). Specifically, in Example 2, for example, using CVD and etching, an insulating layer 73, for example, composed of $SiO_2$, is formed on the mesa structure 50, the exposed first compound semiconductor layer 20, and the second electrode (p-side electrode) 72. Then, an opening 73A is formed by removing the insulating layer 73 located on a part of the second electrode (p-side electrode) 72 (refer to FIG. 10B).

[Step-250]

Subsequently, as in Step-150 in Example 1, for example, using a lift-off technique and vacuum deposition, a second electrode extending portion 72A is formed so as to extend from the second electrode 72 over the insulating layer 73 disposed on the side face of the protrusion 80 provided on the sidewall portion 51 of the mesa structure 50 onto the insulating layer 73 disposed on the first compound semiconductor layer 20. Next, a pad portion (not shown) is formed on a portion of the second electrode extending portion 72A located above the first compound semiconductor layer 20. Then, a first electrode (n-side electrode 71) is formed on the back face of the substrate 10. The first electrode (n-side electrode 71) is connected to the first compound semiconductor layer 20 through the substrate 10. Next, after alloying treatment is performed, a light-emitting element is separated (isolated), for example, by dicing, and thereby the light-emitting element of Example 2 shown in FIGS. 8A and 8B can be obtained.

In Example 2, a second electrode 72 is disposed on the protrusion 80, which corresponds to a part of the edge of the top face of the second compound semiconductor layer 40. Consequently, unlike in the related art, it is not always necessary to provide the second electrode continuously, in the shape of a ring, on the periphery of the top face of the second compound semiconductor layer in the mesa structure. Therefore, even if a large displacement occurs between the current constriction region 44 disposed in the mesa structure 50 and the second electrode 72, a current can be reliably supplied from the second electrode 27 to the second compound semiconductor layer 40 in the mesa structure 50, and moreover, the possibility is low that light from the active layer 30 is blocked by the second electrode 72 provided on the top face of the protrusion 80. Furthermore, since the area of the second electrode 72 to be provided on the top face of the second compound semiconductor layer can be decreased, it is possible to decrease a capacitance, i.e., parasitic capacitance, formed by the second electrode 72, the insulation region 43P, and the first electrode 71. As described above, broadly speaking, the second embodiment of the present invention includes the first embodiment of the present invention.

Example 3

Figure 13A:
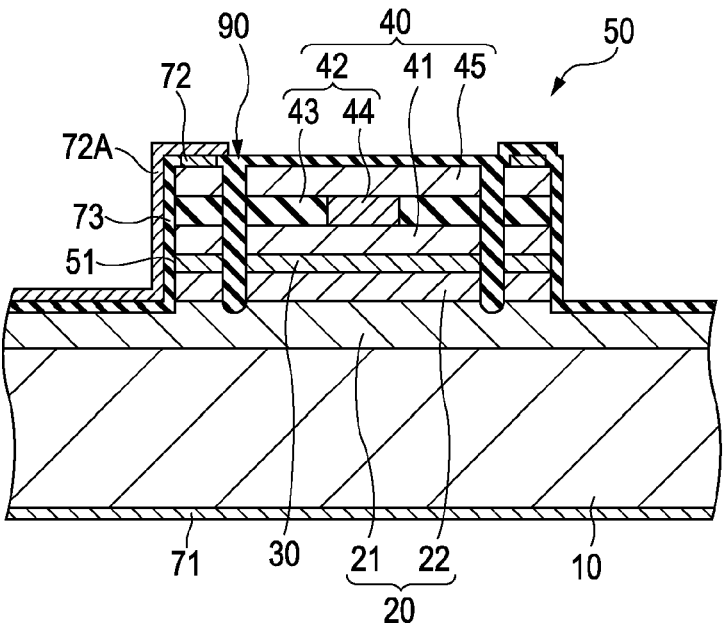
FIGS. 13A and 13B are a schematic partial cross-sectional view and a schematic partial plan view, respectively, of a light-emitting element in Example 3.
Figure 13B:
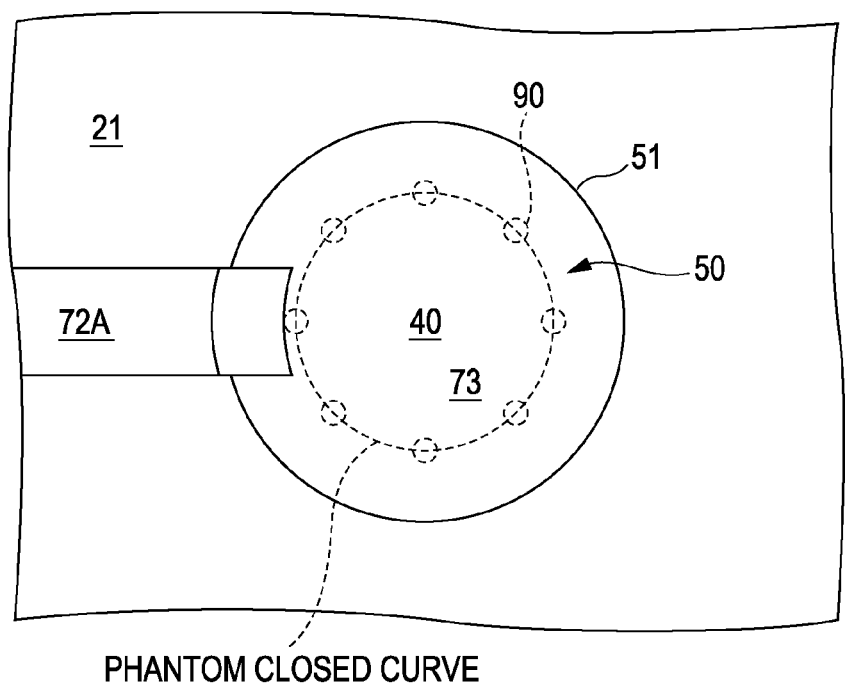

Example 3 relates to a light-emitting element according to the third embodiment of the present invention and a method for manufacturing the light-emitting element according to the third embodiment. FIGS. 13A and 13B are a schematic partial cross-sectional view and a schematic partial plan view, respectively, of a light-emitting element in Example 3.

As in Example 1, the light-emitting element of Example 3 has a mesa structure 50 in which a first compound semiconductor layer 20 of the first conductivity type (n type), an active layer 30, and a second compound semiconductor layer 40 of the second conductivity type (p type) are disposed in that order (specifically, disposed in that order on a substrate 10). At least one of the first compound semiconductor layer 20 and the second compound semiconductor layer 40 has a current constriction region 44 surrounded by an insulation region 43 extending inward from a sidewall portion 51 of the mesa structure 50. That is, the light-emitting element of Example 3 has the mesa structure 50 in which the current constriction region 44 surrounded by the insulation region 43 is disposed in the form of a layer in a part of the second compound semiconductor layer 40. An outer edge of the insulation region 43 extends to the sidewall portion 51 of the mesa structure 50, and the first compound semiconductor layer 20 is partially exposed. The light-emitting element further includes a second electrode (p-side electrode) 72, a second electrode extending portion 72A, and a first electrode (n-side electrode) 71 electrically connected to the first compound semiconductor layer 20.

In the light-emitting element of Example 3, an insulating layer 73 is disposed on at least the sidewall portion 51 of the mesa structure 50 and the exposed first compound semiconductor layer 20 (more specifically, an exposed first DBR layer 21). A second electrode (p-side electrode) 72 is provided on a top face of the mesa structure 50 in a region located on the sidewall portion 51 side of a region in which a plurality of point-like holes 90 are disposed, the second electrode 72 being electrically connected to the second compound semiconductor layer 40. Furthermore, the second electrode extending portion 72A extends from the second electrode 72 over the insulating layer 73 disposed on the sidewall portion 51 of the mesa structure 50 to the lower end of the mesa structure 50 and further extends onto the insulating layer 73 disposed on the first compound semiconductor layer 20. The plurality of point-like holes 90 are formed so as to extend in the thickness direction at least in the insulation region 43 and a portion of the second compound semiconductor layer 40 thereon.

Figure 18B:
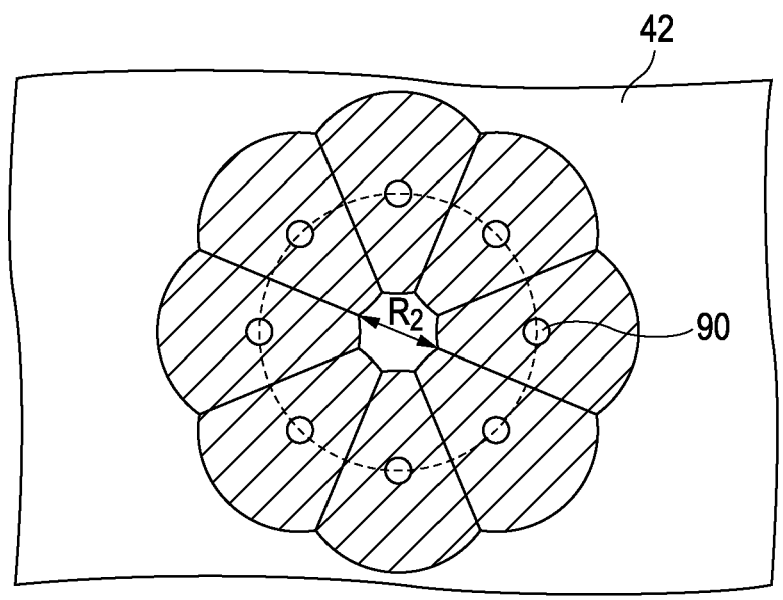
Figure 19A:
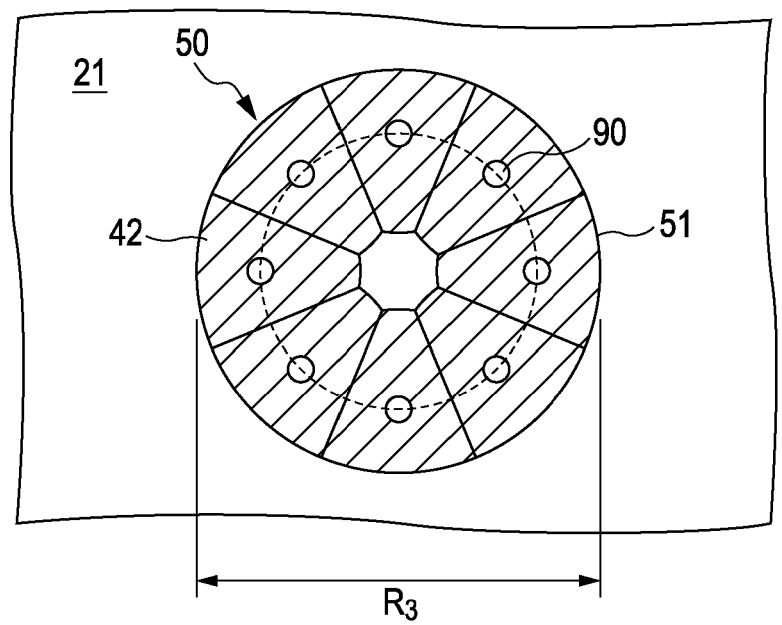
FIG. 19A is a schematic phantom cross-sectional view of a middle layer taken parallel to the principal surface of the substrate in a step, subsequent to the step illustrated in FIG. 18B, in the method for manufacturing the light-emitting element in Example 3, illustrating an insulation region.
Figure 19B:
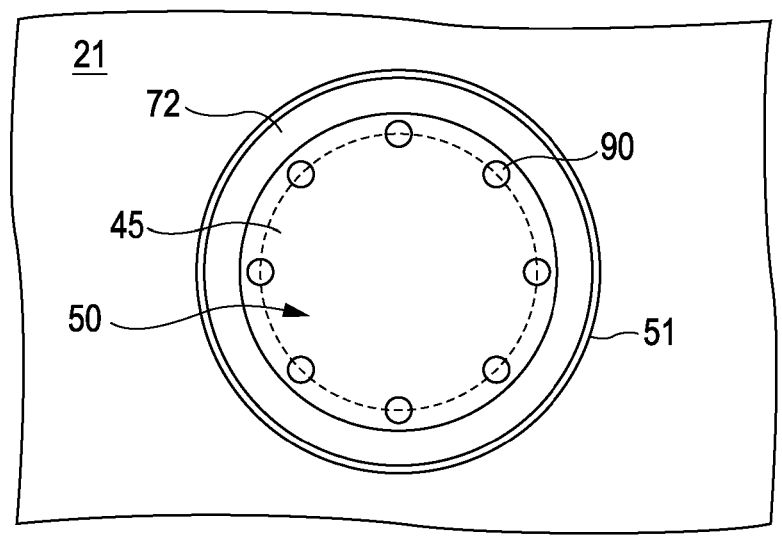
FIG. 19B is a schematic diagram of the second compound semiconductor layer viewed from above in a step subsequent to the step illustrated in FIG. 19A.
Figure 20:
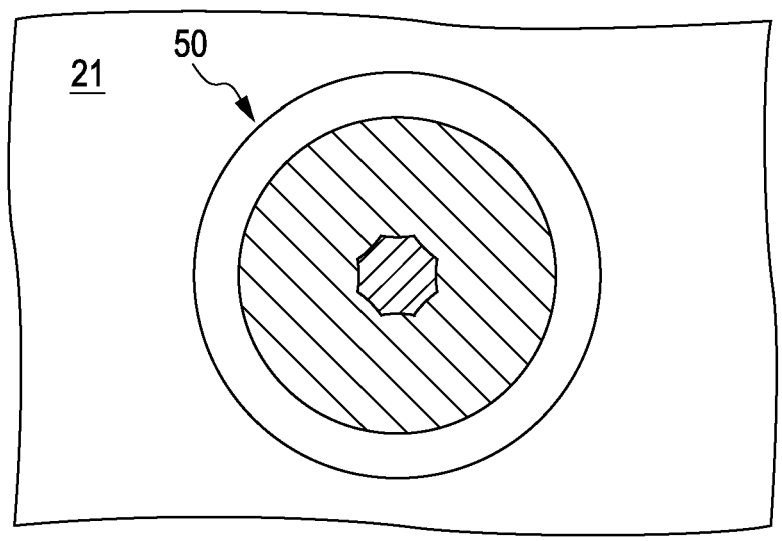
FIG. 20 is a schematic diagram illustrating the relationship between a projection of an outer edge of a current constriction region and a projection of an outer edge of a portion of the top face of the second compound semiconductor layer in which a second electrode is not disposed in Example 3.

In the light-emitting element of Example 3, specifically, the second electrode 72 is continuously provided in the shape of a ring on the edge of the top face of the second compound semiconductor layer 40 (refer to FIG. 19B). The planar shape of the current constriction region 44 is a substantially equilateral octagon with depressed sides. When a circle having the same area as that of such a planar shape is assumed, the diameter $R_2$ (refer to FIG. 18B) of the circle is 10 µm. Furthermore, the mesa structure 50 is cylindrical, and the diameter $R_3$ thereof (refer to FIG. 19A) is 30 µm. Furthermore, the relationship $S_{Conf}/S_{E2}<1$ is satisfied, wherein $S_{Conf}$ is the area of the current constriction region 44 and $S_{E2}$ is the area of a portion of the top face of the second compound semiconductor layer 40 where the second electrode 72 is not disposed. Furthermore, the projection of the outer edge of the current constriction region 44 is contained in the projection of the outer edge of the portion of the top face of the second compound semiconductor layer 40 where the second electrode 72 is not provided. Furthermore, the minimum value of the shortest distance between the projection of the outer edge of the current constriction region 44 and the projection of the outer edge of the portion of the top face of the second compound semiconductor layer 40 where the second electrode 72 is not provided $1\times10^{-6}$ m. FIG. 20 is a schematic diagram illustrating the relationship between the projection of the outer edge of the current constriction region 44 and the projection of the outer edge of the portion of the top face of the second compound semiconductor layer 40 where the second electrode 72 is not provided. In FIG. 20, the projection of the outer edge of the current constriction region 44 is indicated by lines slanting from the upper right to the lower left, and the projection of the outer edge of the portion of the top face of the second compound semiconductor layer 40 where the second electrode 72 is not provided is indicated by lines slanting from the upper left to the lower right.

Figure 15A:
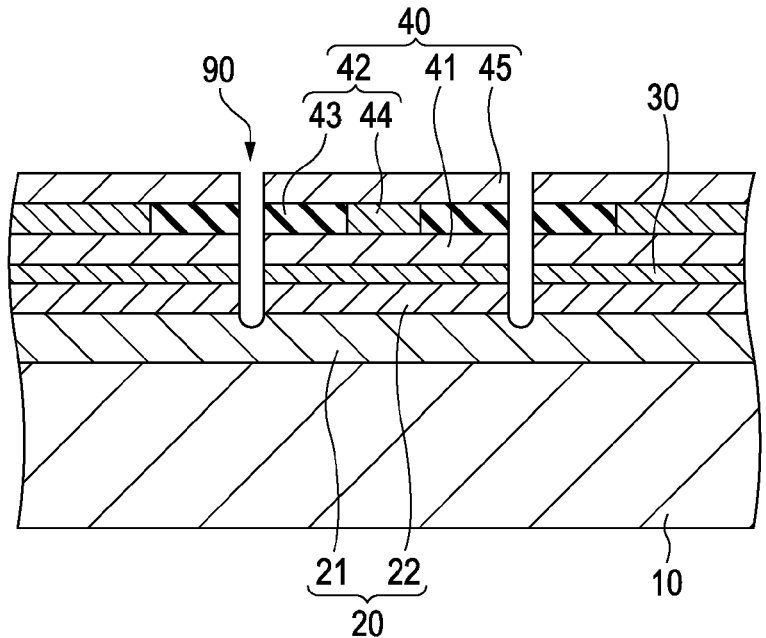
FIGS. 15A and 15B are each a schematic partial cross-sectional view of the substrate, etc. for illustrating a step, subsequent to the step illustrated in FIG. 14B, in the method for manufacturing the light-emitting element in Example 3.
Figure 15B:
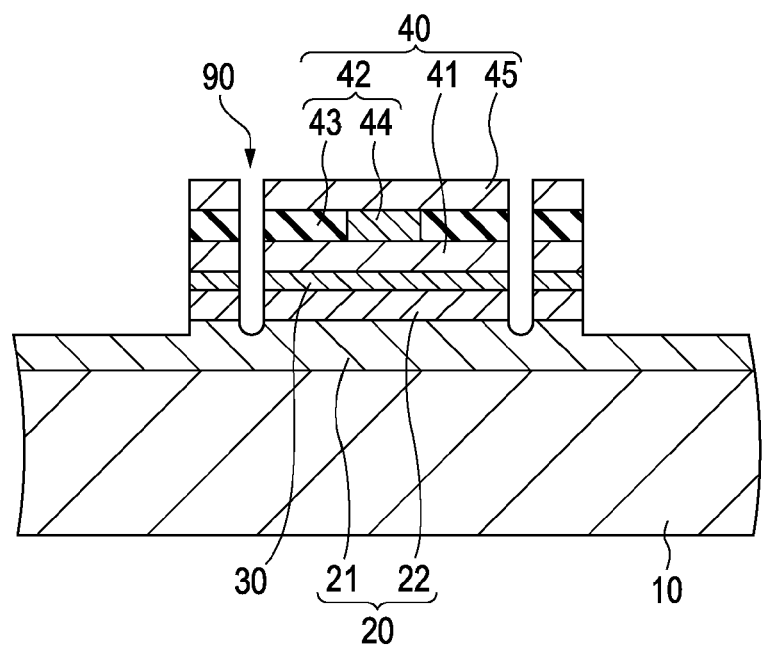
Figure 16A:
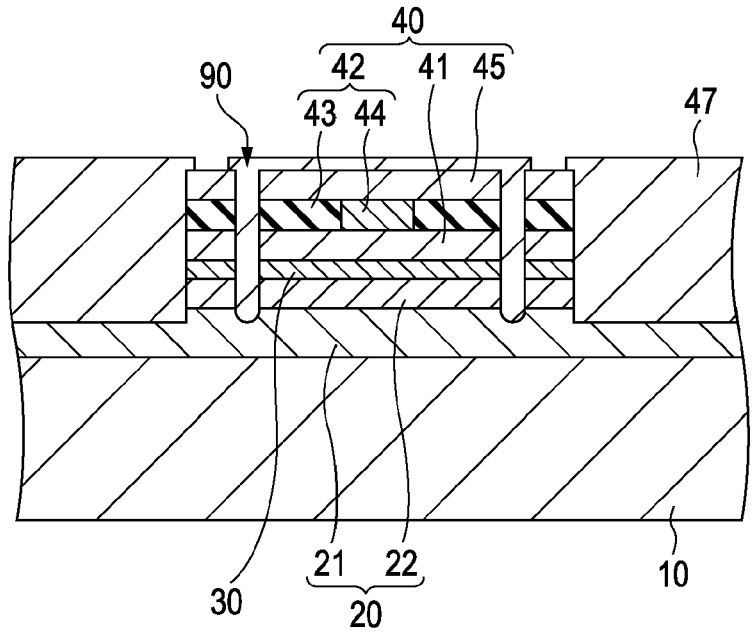
FIGS. 16A and 16B are each a schematic partial cross-sectional view of the substrate, etc. for illustrating a step, subsequent to the step illustrated in FIG. 15B, in the method for manufacturing the light-emitting element in Example 3.
Figure 16B:
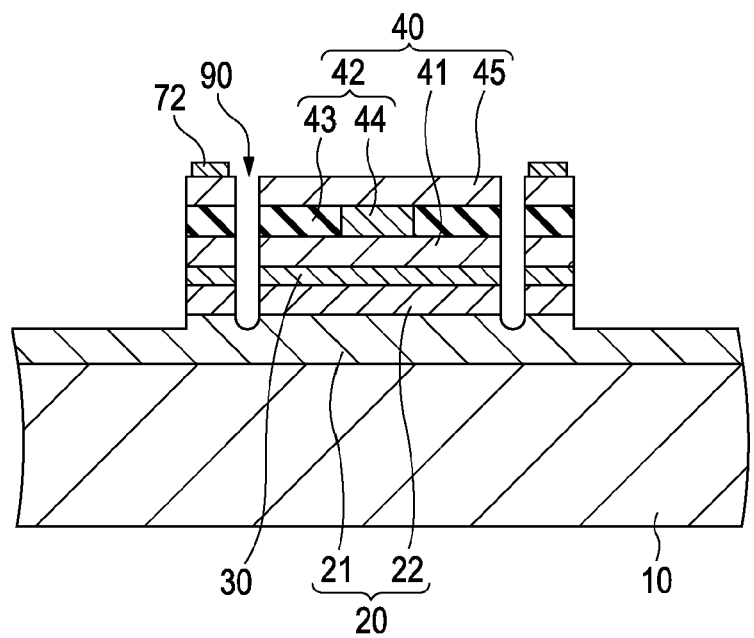
Figure 17A:
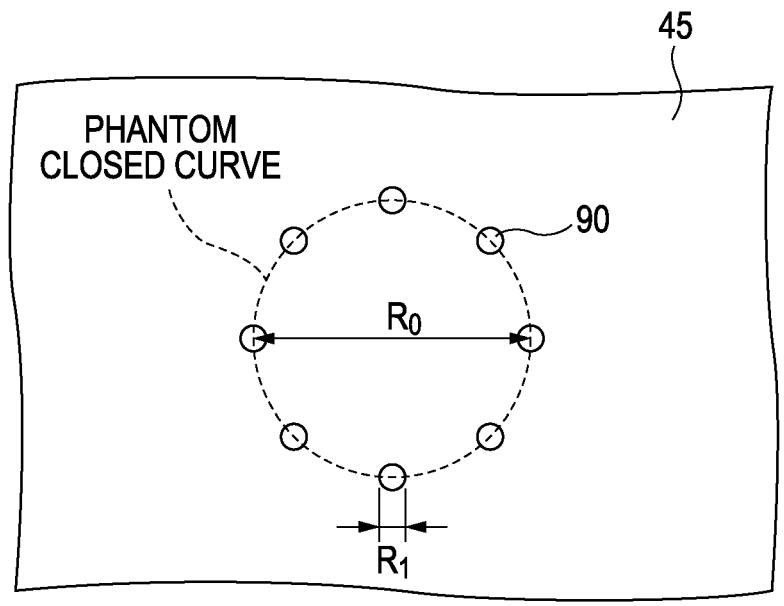
FIG. 17A is a schematic diagram of a second compound semiconductor layer viewed from above in a step in the method for manufacturing the light-emitting element in Example 3.

A method for manufacturing a light-emitting element of Example 3 will be outlined below with reference to FIGS. 14A, 14B, 15A, 15B, 16A, and 16B which are each a schematic partial cross-sectional view of a substrate, etc., FIGS. 17A and 19B which are each a schematic diagram of a second compound semiconductor layer viewed from above, and FIGS. 17B, 18A, 18B, and 19A which are each a schematic phantom cross-sectional view of a middle layer 42 taken parallel to the principal surface of the substrate 10.

[Step-300]

First, as in Step-100 in Example 1, using known MOCVD, a first compound semiconductor layer 20 of a first conductivity type (specifically, n type) including a first DBR layer 21 and a first cladding layer 22, an active layer 30, and a second compound semiconductor layer 40 of a second conductivity type (specifically, p type) including a lower layer (second cladding layer) 41, a middle layer (current constriction layer) 42, and an upper layer (second DBR layer) 45, are formed (deposited) in that order on a principal surface of a substrate 10 composed of n-GaAs (refer to FIG. 2A).

[Step-310]

Figure 14A:
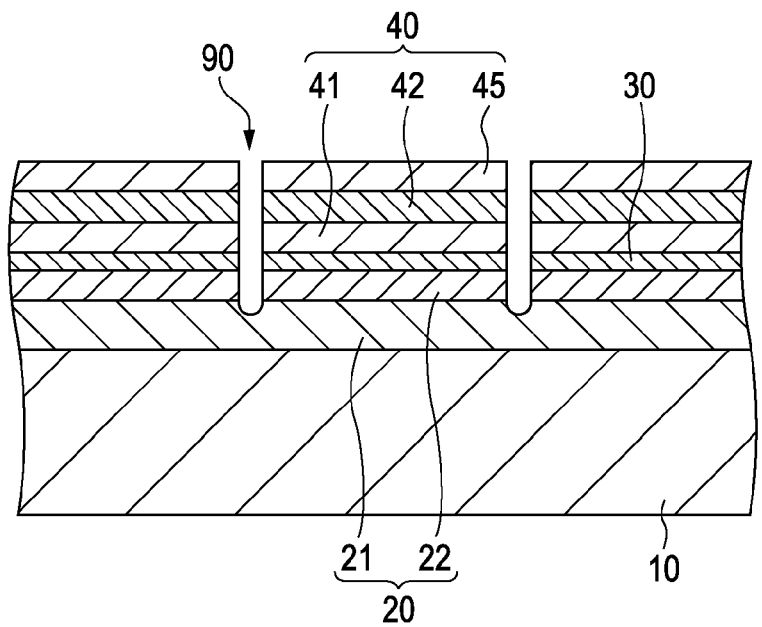
FIGS. 14A and 14B are each a schematic partial cross-sectional view of a substrate, etc. for illustrating a step in a method for manufacturing the light-emitting element in Example 3.
Figure 17B:
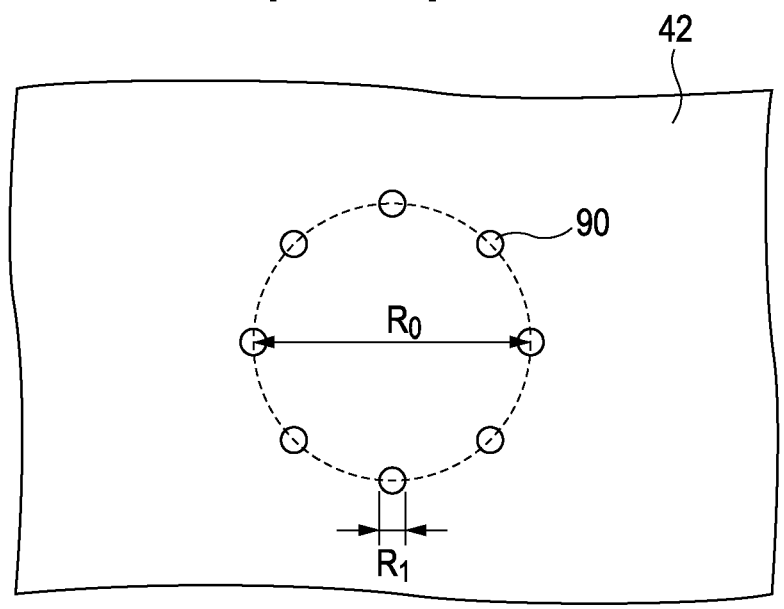
FIG. 17B is a schematic phantom cross-sectional view of a middle layer taken parallel to the principal surface of the substrate.

Then, using lithography and dry etching, a plurality of point-like holes (microscopic holes) 90 are formed so as to extend in the thickness direction at least in a region of the second compound semiconductor layer 40 in which the current constriction region 44 is to be formed. FIG. 14A is a schematic partial cross-sectional view in this state and FIG. 17A is a schematic diagram of the second compound semiconductor layer 40 viewed from above. FIG. 17B is a schematic phantom cross-sectional view of the middle layer 42 taken parallel to the principal surface of the substrate 10. In Example 3, specifically, the holes 90 pass through the second compound semiconductor layer 40 and the active layer 30 and extend to the middle of the first compound semiconductor layer 20 in the thickness direction. Here, the number M of the holes 90 is eight, and the diameter $R_1$ of the hole 90 having a circular cross section (refer to FIG. 17A) is set at 4 µm. Tops of the plurality of point-like holes 90 are arranged on a phantom closed curve located in a region where the current constriction region is to be formed (specifically, a circle indicated by a dotted line in FIGS. 17A and 17B with a diameter $R_0=30$ µm). Therefore, $(M\times R_1^2)/R_0^2=8\times4^2/30^2$.

[Step-320]

Figure 14B:
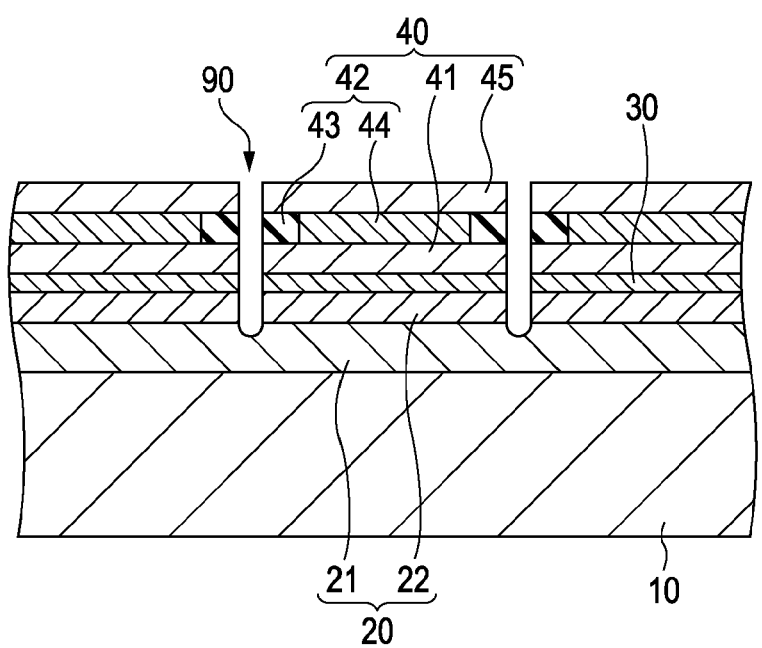
Figure 18A:
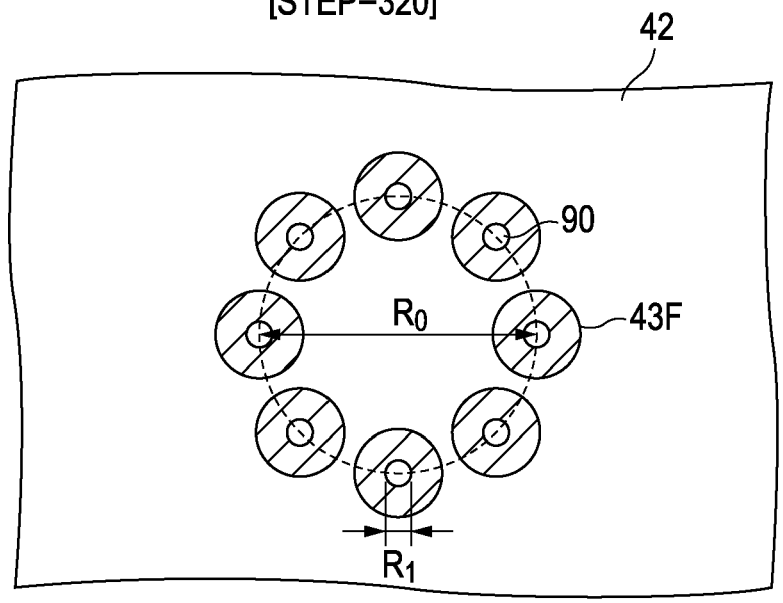
FIGS. 18A and 18B are each a schematic phantom cross-sectional view of the middle layer taken parallel to the principal surface of the substrate in a step, subsequent to the step illustrated in FIG. 17B, in the method for manufacturing the light-emitting element in Example 3, illustrating a state of the progress of insulating treatment in the middle layer.

Next, insulating treatment is performed on a part of at least one of the first compound semiconductor layer 20 and the second compound semiconductor layer 40 from sidewalls of the holes 90 to form the insulation region 43. Specifically, insulating treatment (specifically, oxidizing treatment) is performed on a part of the second compound semiconductor layer 40 from the sidewalls of the holes 90 to form the insulation region 43. In such a manner, it is possible to obtain the current constriction region 44 surrounded by the insulation region 43 in the second compound semiconductor layer 40. More specifically, the substrate 10 is exposed to, for example, an air atmosphere containing 1% by volume of water vapor at a temperature of 100° C. As a result, the middle layer 42 composed of AlAs begins to be oxidized by water vapor from the sidewalls of the holes 90. Although the sidewalls of the holes 90 in the other compound semiconductor layers are exposed to water vapor, the rate of oxidation is significantly lower than that of the middle layer 42 composed of AlAs. For example, by continuing the exposure to such an atmosphere for 10 minutes, it is possible to obtain a current constriction region 44 surrounded by the insulation region 43 in the middle layer 42 of the second compound semiconductor layer 40. FIG. 14B is a schematic partial cross-sectional view showing a state where the formation of the insulation region 43 is in progress, and FIG. 15A is a schematic partial cross-sectional view showing a state where the formation of the insulation region 43 is completed. Furthermore, FIGS. 18A and 18B are each a schematic phantom cross-sectional view of the middle layer 42 taken parallel to the principal surface of the substrate 10. FIG. 18A shows a state immediately after the start of the oxidizing treatment, and FIG. 18B shows a state where the oxidizing treatment is completed. Here, insulating treatment from a sidewall of one hole 90 allows the formation of an insulation region 43 to proceed and insulation treatment from a sidewall of a hole adjacent to the one hole allows the formation of an insulation region 43 to proceed. In FIGS. 18A and 18B and FIG. 19A, which will be described later, in order to clearly show the insulation region 43, the insulation region 43 is hatched.

For example, in step-220 in Example 2, as the oxidation proceeds, the oxidation reaction rate increases. That is, since the oxidation is performed from the sidewall portion 51 of the mesa structure 50, when the formation of the insulation region 43 is allowed to proceed toward the center in the middle layer 42 of the second compound semiconductor layer 40 by the oxidizing treatment, the area of the boundary (insulation region front 43F) of the second compound semiconductor layer 40 at which the oxidation proceeds decreases, and the amount of oxidizing species (such as water molecules and oxygen molecules) per unit area of the insulation region front 43F increases. As a result, as the oxidation proceeds, the oxidation reaction rate increases, and thus there may be a case where it is difficult to accurately control the width of the insulation region 43.

On the other hand, in Example 3, when insulating treatment (specifically, oxidizing treatment) is performed on a part of the second compound semiconductor layer 40 (specifically, the middle layer 42) from the sidewalls of the holes 90 and when insulating treatment from a sidewall of one hole 90 allows the formation of an insulation region 43 to proceed and insulation treatment from a sidewall of a hole 90 adjacent to the one hole allows the formation of an insulation region 43 to proceed (refer to FIGS. 18A and 18B), before these two insulation regions 43 are connected with each other, the curvature of the boundary of each insulation region 43 (insulation region front 43F) on the basis of the hole 90 is positive. Alternatively, before these two insulation regions 43 are connected with each other, the length of the boundary (insulation region front 43F) of each insulation region 43 of which formation is allowed to proceed by insulating treatment increases with the progress of the insulating treatment. Consequently, when the formation of the insulation region 43 in the middle layer 42 of the second compound semiconductor layer 40 is allowed to proceed toward the center of the mesa structure 50 by the oxidizing treatment, the area of the boundary (insulation region front 43F) of the second compound semiconductor layer 40 at which the oxidation proceeds increases, and the amount of oxidizing species (such as water molecules and oxygen molecules) per unit area of the insulation region front 43F decreases. As a result, as the oxidation proceeds, the oxidation reaction rate decreases, and thus it is possible to easily and accurately control the width of the insulation region 43 on the basis of the adjustment of the oxidation time.

[Step-330]

Then, for example, using lithography and etching, by selectively removing the second compound semiconductor layer 40, the active layer 30, and a part of the first compound semiconductor layer 20 located outside the portion where the holes 90 are formed, the first compound semiconductor layer 20 is partially exposed. Thereby, it is possible to obtain a columnar (e.g., circular cylindrical or columnar) mesa structure 50 in which the first compound semiconductor layer 20, the active layer 30, and the second compound semiconductor layer 40 are disposed in that order on the substrate 10, the current constriction region 44 in the form of a layer surrounded by the insulation region 43 is disposed in a part of the second compound semiconductor layer 40, the outer edge of the insulation region 43 extends to the sidewall portion 51, and at least the second compound semiconductor layer 40 and the active layer 30 remain like an island (refer to FIGS. 15B and 19A). More specifically, the mesa structure 50 includes a part of the first compound semiconductor layer 20, the active layer 30, and the second compound semiconductor layer 40 disposed in that order from the bottom. The mesa structure 50 is surrounded by the exposed first compound semiconductor layer 20. The holes 90 are allowed to remain. The diameter of the mesa structure 50 is, for example, 40 µm.

[Step-340]

Next, as in Step-130 in Example 1, for example, using a lift-off technique and vapor deposition, a second electrode (p-side electrode) 72 is formed on an edge of the top face of the second compound semiconductor layer 40 constituting the mesa structure 50. Specifically, a resist layer 47 is formed such that the edge of the top face of the second compound semiconductor layer 40 (the edge of the upper layer 45) on which the second electrode (p-side electrode) 72 is to be formed is exposed (refer to FIG. 16A). Then, a layered structure of Ti layer/Au layer is formed by vacuum deposition, followed by removal of the resist layer. FIG. 16B is a schematic partial cross-sectional view and FIG. 19B is a schematic partial plan view each showing the resulting state.

[Step-350]

Subsequently, as in Step-240 in Example 2, an insulating layer 73 is formed on the sidewall portion 51 of the mesa structure 50 and the exposed first compound semiconductor layer 20 (more specifically, the exposed first DBR layer 21). Specifically, in Example 3, for example, using CVD and etching, an insulating layer 73, for example, composed of $SiO_2$, is formed on the mesa structure 50, the exposed first compound semiconductor layer 20, and the second electrode (p-side electrode) 72. Then, an opening is formed by removing the insulating layer 73 located on a part of the second electrode (p-side electrode) 72.

[Step-360]

Subsequently, as in Step-150 in Example 1, for example, using a lift-off technique and vacuum deposition, a second electrode extending portion 72A is formed so as to extend from the second electrode 72 over the insulating layer 73 disposed on the sidewall portion 51 of the mesa structure 50 onto the insulating layer 73 disposed on the first compound semiconductor layer 20. Next, a pad portion (not shown) is formed on a portion of the second electrode extending portion 72A located above the first compound semiconductor layer 20. Then, a first electrode (n-side electrode) 71) is formed on the back face of the substrate 10. The first electrode (n-side electrode 71) is connected to the first compound semiconductor layer 20 through the substrate 10. Next, after alloying treatment is performed, a light-emitting element is separated (isolated), for example, by dicing, and thereby the light-emitting element of Example 3 shown in FIGS. 13A and 13B can be obtained.

In Example 3, the plurality of point-like holes 90 which reach at least the insulation region 43 are disposed so as to extend in the lamination direction. That is, the plurality of point-like holes 90 are disposed in the thickness direction at least in the insulation region 43 and the portion of the second compound semiconductor layer 40 thereon. The formation of the insulation region 43 starts from the sidewalls of the holes 90, and each insulation region expands outward with the corresponding hole 90 serving as a center. Consequently, the amount of the species to be used in insulating treatment, such as an oxidizing species, per unit area of the insulation region front 43F decreases as the insulating treatment progresses, and thus the rate of the insulating treatment decreases. Therefore, even if the current constriction structure is small, it is possible to easily and accurately control the width of the current constriction region 44 or the width of the insulation region 43. Moreover, since merely the plurality of point-like holes 90 are formed, the formation of the current constriction region 44 itself is easy. Consequently, it is possible to satisfy requirements for reduction in size of the mesa structure 50 and size of the current constriction region 44. At the same time, it is possible to provide the second electrode 72 on the top face of the second compound semiconductor layer sufficiently apart from the space above the current constriction region 44 so that light from the active layer 30 is not blocked by the second electrode 72 even if a large displacement occurs between the current constriction region 44 and the second electrode 72 disposed on the top face of the second compound semiconductor layer 40. Furthermore, since the area of the second electrode 72 to be provided on the top face of the second compound semiconductor layer 40 can be decreased, it is possible to decrease a capacitance, i.e., parasitic capacitance, formed by the second electrode 72, the insulation region 43, and the first electrode 71.

The present invention has been described based on the examples according to the preferred embodiments. However, it is to be understood that the present invention is not limited to the examples. The configuration and structure of the light-emitting element, the materials and compositions for the light-emitting element, etc. described in each of Examples 1 to 3 are merely examples, and can be changed appropriately. For example, a laminate structure may be formed so as to include a second compound semiconductor layer, an active layer, and a first compound semiconductor layer disposed in that order from the substrate side. That is, it may be possible to form, on an appropriate substrate, a laminate structure in which the individual layers of the light-emitting element in the laminate structure described in each of Examples 1 to 3 are placed in a reversed order, i.e., a laminate structure in which the second DBR layer 45 of the second compound semiconductor layer 40 is the bottom layer, and the first DBR layer 21 of the first compound semiconductor layer 20 is the top layer. Furthermore, as the substrate 10, an insulating substrate may be used.

It should be understood by those skilled in the art that various modifications, combinations, sub-combinations and alterations may occur depending on design requirements and other factors insofar as they are within the scope of the appended claims or the equivalents thereof.

What is claimed is:
1. A light-emitting element comprising, in this order in a cross-sectional view of the light-emitting element:
 a first distributed Bragg reflector;
 an active layer;
 a current constriction region;
 a second distributed Bragg reflector;
 a first insulation region in a first portion of a wall structure; and
 a second insulation region in a second portion of the wall structure,
 wherein the current constriction region is between the first insulation region and the second insulation region,
 wherein the active layer and the current constriction region are formed in a mesa structure,
 wherein along a direction in a plan view of the light-emitting element, a first portion of a groove is between the mesa structure and the first portion of the wall structure,
 wherein along the direction in the plan view of the light-emitting element, a second portion of the groove is between the mesa structure and the second portion of the wall structure,
 wherein a first electrode is electrically connected to the first distributed Bragg reflector,
 wherein a second electrode is electrically connected to the second distributed Bragg reflector, the second electrode being is not located just above an edge of the current constriction region in the cross-sectional view of the light-emitting element.

2. The light-emitting element according to claim 1, wherein the second electrode has a ring configuration in the plan view of the light-emitting element, and wherein the second electrode is not located just above both edges of the current constriction region in the cross-sectional view of the light-emitting element.

3. The light-emitting element according to claim 2, wherein the ring configuration is an annular ring configuration.

4. The light-emitting element according to claim 1, wherein the second electrode touches the second distributed Bragg reflector.

5. The light-emitting element according to claim 1, wherein the current constriction region is a group III-IV compound semiconductor material surrounded by an insulator.

6. The light-emitting element according to claim 1, wherein the second distributed Bragg reflector layer is in the mesa structure.

7. The light-emitting element according to claim 1, wherein the current constriction region is surrounded by a mesa insulation region, the mesa insulation region being in the mesa structure.

8. The light-emitting element according to claim 7, wherein the mesa insulation region extends from a sidewall portion of the mesa structure to the current constriction region.

9. The light-emitting element according to claim 7, wherein the mesa insulation region contains gallium and arsenide.

10. The light-emitting element according to claim 1, wherein the first portion of the wall structure is between the first distributed Bragg reflector layer and the second electrode.

11. The light-emitting element according to claim 10, wherein the second electrode touches the first portion of the wall structure.

12. The light-emitting element according to claim 1, wherein the first portion of the wall structure is between the first distributed Bragg reflector layer and the second electrode.

13. The light-emitting element according to claim 1, wherein the first distributed Bragg reflector layer is between the first electrode and the first portion of the wall structure.

14. The light-emitting element according to claim 1, wherein the first insulation region is an oxide layer.

15. The light-emitting element according to claim 1, wherein the first insulation region contains gallium and arsenide.

16. The light-emitting element according to claim 1, wherein the first portion of the groove is a gap between the mesa structure and the first portion of the wall structure.

17. The light-emitting element according to claim 1, wherein the second portion of the groove is a gap between the mesa structure and the second portion of the wall structure.

18. The light-emitting element according to claim 17, wherein the first distributed Bragg reflector layer is between the first electrode and the second portion of the wall structure.

19. The light-emitting element according to claim 18, wherein the second electrode touches the second portion of the wall structure.

20. The light-emitting element according to claim 1, wherein the second portion of the wall structure is between the second distributed Bragg reflector layer and the second electrode.

21. The light-emitting element according to claim 1, wherein the second insulation region contains gallium and arsenide.

22. The light-emitting element according to claim 1, wherein the second insulation region is an oxide layer.

23. The light-emitting element according to claim 22, wherein the first electrode is a metallic material.

24. The light-emitting element according to claim 22, wherein the second electrode includes a metal.

* * * * *